United States Patent
Sano et al.

(10) Patent No.: US 9,985,125 B1
(45) Date of Patent: May 29, 2018

(54) SILICON CARBIDE SEMICONDUCTOR DEVICE

(71) Applicant: Panasonic Intellectual Property Management Co., Ltd., Osaka (JP)

(72) Inventors: Tsuneichiro Sano, Toyama (JP); Atsushi Ohoka, Kyoto (JP); Tsutomu Kiyosawa, Toyama (JP); Osamu Ishiyama, Nara (JP); Takayuki Wakayama, Toyama (JP); Kouichi Saitou, Toyama (JP); Takashi Hasegawa, Toyama (JP); Daisuke Shindo, Toyama (JP); Osamu Kusumoto, Nara (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days. days.

(21) Appl. No.: 15/812,430

(22) Filed: Nov. 14, 2017

(30) Foreign Application Priority Data

Nov. 25, 2016 (JP) .................................. 2016-228715
Sep. 26, 2017 (JP) .................................. 2017-185066

(51) Int. Cl.
*H01L 31/0312* (2006.01)
*H01L 29/78* (2006.01)
(Continued)

(52) U.S. Cl.
CPC ...... *H01L 29/7811* (2013.01); *H01L 23/3192* (2013.01); *H01L 29/0619* (2013.01);
(Continued)

(58) Field of Classification Search
CPC ............. H01L 23/3192; H01L 29/0619; H01L 29/1095; H01L 29/1608; H01L 29/42356
See application file for complete search history.

(56) References Cited

U.S. PATENT DOCUMENTS

2014/0197476 A1  7/2014  Shimatou
2017/0110545 A1  4/2017  Nagao et al.

FOREIGN PATENT DOCUMENTS

JP   2014-138090   7/2014
JP   2015-220334   12/2015

*Primary Examiner* — Samuel Gebremariam
(74) *Attorney, Agent, or Firm* — McDermott Will & Emery LLP

(57) ABSTRACT

A silicon carbide semiconductor device includes a first conductivity type silicon carbide substrate having an active region and a termination region surrounding the active region, a plurality of unit cells located in the active region, and a termination structure located in the termination region. Each unit cell is provided with a transistor structure. The termination structure includes the silicon carbide semiconductor layer, a second conductivity type second body region surrounding the active region, one or more second conductivity type rings surrounding the second body region, one or more outer-circumferential upper source electrodes surrounding the active region, and an upper gate electrode. The silicon carbide semiconductor device further includes a first protective film and a second protective film. The first protective film covers the inner-circumferential upper source electrode, the upper gate electrode, and an inner side surface of the one or more outer-circumferential upper source electrodes except for a pad region. The second protective film covers the first protective film and at least a part of the one or more second conductivity type rings.

12 Claims, 17 Drawing Sheets

(51) Int. Cl.
*H01L 29/16* (2006.01)
*H01L 29/06* (2006.01)
*H01L 29/423* (2006.01)
*H01L 23/31* (2006.01)
*H01L 29/10* (2006.01)

(52) U.S. Cl.
CPC ...... *H01L 29/1095* (2013.01); *H01L 29/1608* (2013.01); *H01L 29/42356* (2013.01)

CRACK IN PROTECTIVE FILM

RISING OF PROTECTIVE FILM

CRACK IN PROTECTIVE FILM

RISING OF PROTECTIVE FILM

SILICON CARBIDE SEMICONDUCTOR DEVICE

BACKGROUND

1. Technical Field

The present disclosure is related to a silicon carbide semiconductor device.

2. Description of the Related Art

A power semiconductor device is a semiconductor element used for causing a high current to flow with a high breakdown voltage, and is required to have a low power loss. Conventionally, a power semiconductor device using a silicon (Si) substrate has been dominant, but recently, a power semiconductor device using a silicon carbide (SiC) substrate has received attention and has been developed.

Because of a dielectric breakdown electric field one order magnitude higher than that of silicon (Si), silicon carbide (SiC) has a feature of being capable of maintaining a breakdown voltage even if a depletion layer is made thin at a pn junction or a Schottky junction. Therefore, when silicon carbide is used, the thickness of the device can be decreased, and further, a doping concentration can be increased. Accordingly, silicon carbide is expected to be used as a material for forming a power semiconductor device having a low ON resistance, high breakdown voltage, and low power loss.

Recently, vehicles having a motor as a power source, such as hybrid vehicles, electric vehicles, or fuel cell vehicles, have been developed. The above-mentioned feature of silicon carbide is advantageous to a switching element in an inverter circuit for driving the motor of these vehicles, and therefore, silicon carbide power semiconductor device has been developed.

On-board electronic components are required to have more durability against severe environmental conditions than other electronic components for commercial use, from the viewpoint that vehicles are used under various outdoor environments. For example, the durability of electronic components is evaluated by a temperature humidity bias test (hereinafter referred to as THB test). Unexamined Japanese Patent Publication Nos. 2015-220334 and 2014-138090 disclose a semiconductor device having reliability for a high-temperature high-humidity bias environment.

SUMMARY

A silicon carbide semiconductor device according to the present disclosure includes a first conductivity type silicon carbide substrate, a plurality of unit cells, and a termination structure. The first conductivity type silicon carbide substrate has an active region and a termination region surrounding the active region in a plan view. The plurality of unit cells are located in the active region. The termination structure is located in the termination region. Each of the unit cells includes the first conductivity type silicon carbide substrate, a first silicon carbide semiconductor layer disposed on the first conductivity type silicon carbide substrate, a first body region of a second conductivity type selectively formed in a surface of the first silicon carbide semiconductor layer, a source region selectively formed in the first body region, a gate insulating film disposed above the first silicon carbide semiconductor layer, a gate electrode disposed on the gate insulating film, a first contact region in contact with the first body region, and an inner-circumferential upper source electrode electrically connected to the first contact region and the source region. The termination structure includes the first conductivity type silicon carbide substrate, the first silicon carbide semiconductor layer disposed on the first conductivity type silicon carbide substrate, a second body region of a second conductivity type selectively formed in a surface of the first silicon carbide semiconductor layer, one or more second conductivity type rings disposed on the surface of the first silicon carbide semiconductor layer, a second contact region of a second conductivity type selectively formed in a surface of the second body region, an interlayer dielectric film disposed above the second contact region, one or more outer-circumferential upper source electrodes disposed on the interlayer dielectric film, and an upper gate electrode electrically connected to the gate electrode. The second conductivity type second body region has an annular shape surrounding the active region in a plan view. The one or more second conductivity type rings surround the second body region in a plan view. The one or more outer-circumferential upper source electrodes penetrate the interlayer dielectric film to be electrically connected to the second contact region, and surround the active region in a plan view. The upper gate electrode is located between the inner-circumferential upper source electrode in the active region and the outer-circumferential upper source electrode. The silicon carbide semiconductor device further includes a first protective film made of silicon nitride and a second protective film made of an organic material. The first protective film covers the inner-circumferential upper source electrode, the upper gate electrode, and an inner surface of an innermost outer-circumferential upper source electrode among the one or more outer-circumferential upper source electrodes, in the active region and the termination region except for a pad region. The second protective film covers the first protective film and at least a part of the one or more second conductivity type rings, in the active region and the termination region.

According to the silicon carbide semiconductor device in the present disclosure, reliability for a high-temperature high-humidity bias environment can be enhanced.

DETAILED DESCRIPTION OF EMBODIMENT

Figure 1A:
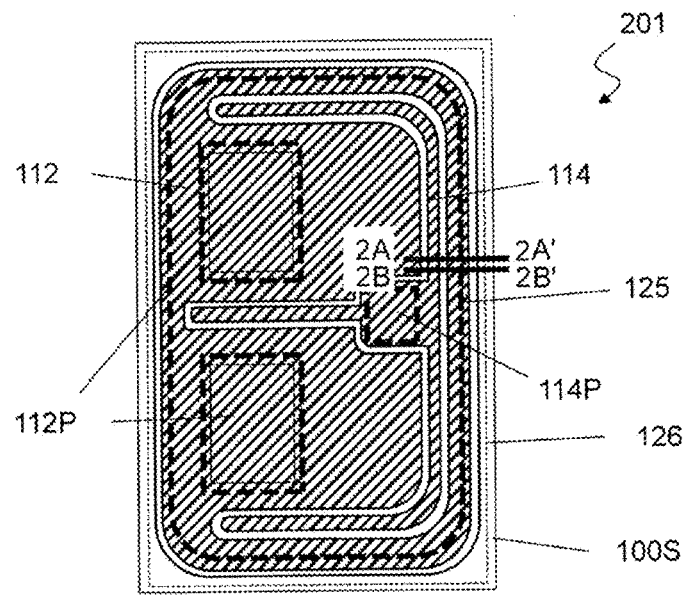
FIG. 1A is a plan view illustrating a silicon carbide semiconductor device according to a first exemplary embodiment.

The above-mentioned conventional semiconductor device is required to have more improved reliability. The present disclosure provides a silicon carbide semiconductor device having more improved reliability.

The inventor of the present application conducted the THB test for the conventional semiconductor devices to evaluate the reliability of the semiconductor devices. The semiconductor device disclosed in Unexamined Japanese Patent Publication No. 2015-220334 includes a protective film covering an entire chip and formed of an organic insulator. The semiconductor device disclosed in Unexamined Japanese Patent Publication No. 2014-138090 includes a two-layer protective film formed of an inorganic protective film and an organic insulating film. When these semiconductor devices were manufactured and subjected to a storage test at 85° C. and 85% relative humidity with a bias voltage of 1200 V being applied, it was confirmed that a threshold voltage drop or drain-source leakage was caused. The threshold voltage drop is considered to occur because the threshold voltage varies due to intrusion of moisture or mobile ions from the protective film. The drain-source leakage is considered to occur due to the following reason. Specifically, the silicon nitride film rises upward or cracks particularly in a termination region of the chip, and moisture intrudes into the semiconductor device from the protective film, which causes a flow of a leakage current.

Based on the knowledge described above, the inventor of the present application has conceived of a silicon carbide semiconductor device having a novel protection structure. The outline of the silicon carbide semiconductor device of the present disclosure is as follows.

The silicon carbide semiconductor device according to the present disclosure includes a first conductivity type silicon carbide substrate, a plurality of unit cells, and a termination structure. The first conductivity type silicon carbide substrate has an active region and a termination region surrounding the active region in a plan view. The plurality of unit cells are located in the active region. The termination structure is located in the termination region. Each of the unit cells includes the first conductivity type silicon carbide substrate, a first silicon carbide semiconductor layer disposed on the first conductivity type silicon carbide substrate, a first body region of a second conductivity type selectively formed in a surface of the first silicon carbide semiconductor layer, a source region selectively formed in the first body region, a gate insulating film disposed above the first silicon carbide semiconductor layer, a gate electrode disposed on the gate insulating film, a first contact region in contact with the first body region, and an inner-circumferential upper source electrode electrically connected to the first contact region and the source region. The termination structure includes the first conductivity type silicon carbide substrate, the first silicon carbide semiconductor layer disposed on the first conductivity type silicon carbide substrate, a second body region of a second conductivity type selectively formed in a surface of the first silicon carbide semiconductor layer, one or more second conductivity type rings disposed in the surface of the first silicon carbide semiconductor layer, a second contact region of a second conductivity type selectively formed in a surface of the second body region, an interlayer dielectric film disposed above the second contact region, one or more outer-circumferential upper source electrodes disposed on the interlayer dielectric film, and an upper gate electrode electrically connected to the gate electrode. The second conductivity type second body region has an annular shape surrounding the active region in a plan view. The one or more second conductivity type rings surround the second body region in a plan view. The one or more outer-circumferential upper source electrodes penetrate the interlayer dielectric film to be electrically connected to the second contact region, and surround the active region in a plan view. The upper gate electrode is located between the inner-circumferential upper source electrode in the active region and the outer-circumferential upper source electrode. The silicon carbide semiconductor device further includes a first protective film made of silicon nitride and a second protective film made of an organic material. The first protective film covers the inner-circumferential upper source electrode, the upper gate electrode, and an inner surface of an innermost outer-circumferential upper source electrode among the one or more outer-circumferential upper source electrodes, in the active region and the termination region except for a pad region. The second protective film covers the first protective film and at least a part of the one or more second conductivity type rings, in the active region and the termination region.

The one or more outer-circumferential upper source electrodes and the inner-circumferential upper source electrode may be electrically connected to each other.

An outer side surface of the first protective film may be positioned between an outermost outer-circumferential upper source electrode among the one or more outer-circumferential upper source electrodes and the one or more second conductivity type rings in a plan view.

An outer side surface of the first protective film may be positioned on an outermost outer-circumferential upper source electrode among the one or more outer-circumferential upper source electrodes in a plan view, and an outer side surface of the outermost outer-circumferential upper source electrode among the one or more outer-circumferential upper source electrodes may be in direct contact with the second protective film.

The termination structure may include two or more of the second conductivity type rings, and the first protective film may cover at least an innermost second conductivity type ring among the two or more of the second conductivity type rings, and may not cover at least an outermost second conductivity type ring among the two or more of the second conductivity type rings.

The termination structure may include three or more of the second conductivity type rings, and the first protective film may cover at least two or more of the second conductivity type rings including an innermost ring among the three or more of the second conductivity type rings, and may not cover at least an outermost second conductivity type ring among the three or more of the second conductivity type rings.

On a cross-section perpendicular to a direction in which the three or more of the second conductivity type rings extend, a distance W between an inner side surface of the innermost second conductivity type ring and an outer side surface of the outermost second conductivity type ring may range from 60 μm to 120 μm, inclusive. In addition, on the cross-section, a distance between an outer side surface of the first protective film and an outer side surface of the innermost second conductivity type ring may range from 18 μm to 50 μm, inclusive.

The silicon carbide substrate may have a scribe line region, and the second protective film may not cover the scribe line region.

The termination structure may include a first base electrode and a second base electrode. The first base electrode is disposed on a surface of the second contact region at an inner-circumferential-side of the second contact region, and is electrically connected to the second contact region. The second base electrode is disposed on a surface of the second contact region at an outer-circumferential-side of the second contact region, and is electrically connected to the second contact region. In addition, the first base electrode may be electrically connected to the inner-circumferential upper source electrode, and the second base electrode may be electrically connected to the one or more outer-circumferential upper source electrodes.

The second base electrode may surround the active region on the surface of the second contact region in a plan view.

The termination structure may be provided with a plurality of first base electrodes in a form of islands.

The silicon carbide semiconductor device may further include a third contact region selectively formed so as to surround the one or more second conductivity type rings in a plan view, a third base electrode electrically in contact with the third contact region, and a seal electrode connected to the third base electrode. The third contact region is located outside of the one or more second conductivity type rings in the surface of the first silicon carbide semiconductor layer. The seal electrode surrounds an outermost second conductivity type ring among the one or more second conductivity type rings in a plan view.

The second protective film may cover the seal electrode.

First Exemplary Embodiment

A silicon carbide semiconductor device according to exemplary embodiments of the present disclosure will now be described herein with reference to the accompanying drawings.

Figure 2A:
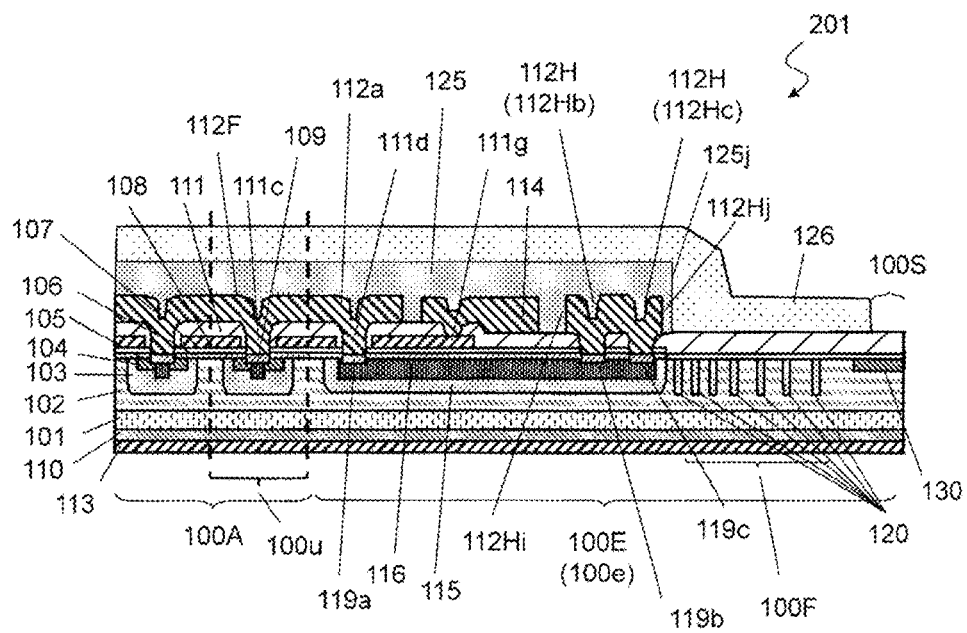
FIG. 2A is a sectional view illustrating the silicon carbide semiconductor device taken along line 2A-2A' in FIG. 1A.
Figure 2B:
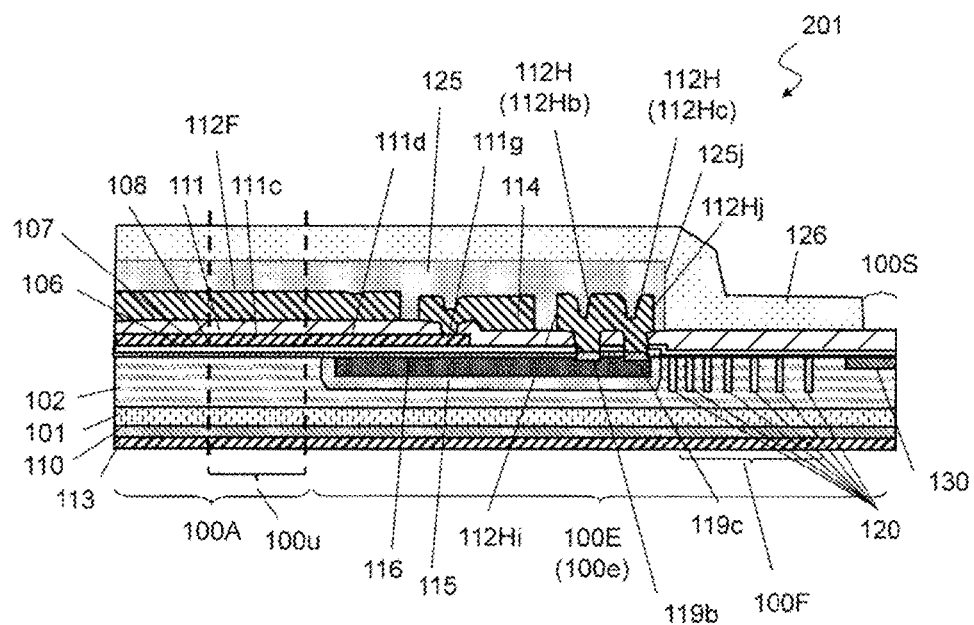
FIG. 2B is a sectional view illustrating the silicon carbide semiconductor device taken along line 2B-2B' in FIG. 1A.
Figure 2C:
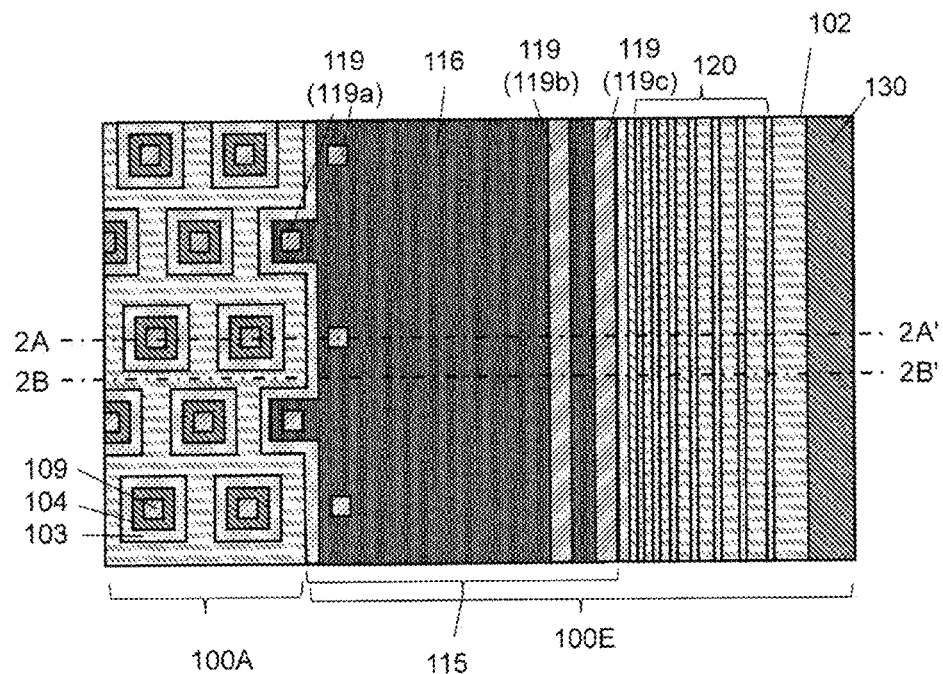
FIG. 2C is a plan view illustrating a surface of a first silicon carbide semiconductor layer near line 2A-2A' and line 2B-2B' in FIG. 1A.

FIG. 1A is a plan view illustrating silicon carbide semiconductor device 201 according to the present exemplary embodiment, and FIGS. 2A and 2B are each a sectional view illustrating silicon carbide semiconductor device 201 taken along line 2A-2A' and line 2B-2B' in FIG. 1A. FIG. 2C is a plan view illustrating a surface of first silicon carbide semiconductor layer 102, to be described later, near line 2A-2A' and line 2B-2B' in FIG. 1A.

Silicon carbide semiconductor device 201 includes first conductivity type silicon carbide substrate 101 and first silicon carbide semiconductor layer (drift layer) 102 disposed on a main surface of silicon carbide substrate 101. Silicon carbide substrate 101 has a back face at which drain electrode 110 and wiring electrode 113 disposed on drain electrode 110 is provided. In this exemplary embodiment, a first conductivity type is n-type, and a second conductivity type is p-type. However, the first conductivity type may be p-type, and the second conductivity type may be n-type.

Figure 1B:
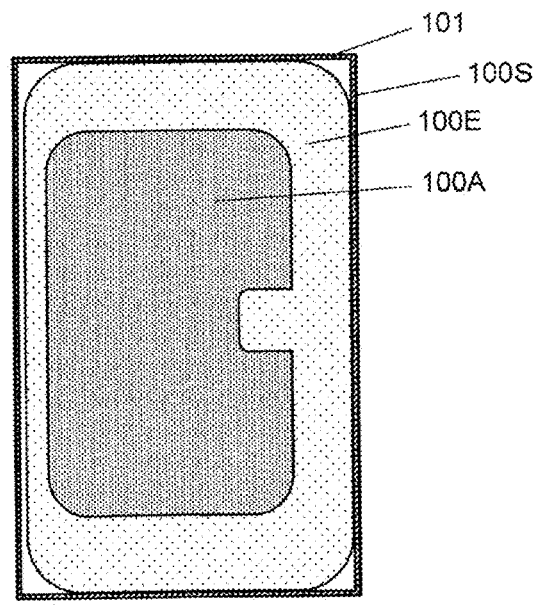
FIG. 1B is a plan view illustrating an active region and a termination region of the silicon carbide semiconductor device illustrated in FIG. 1A.

Silicon carbide substrate 101 includes active region 100A and termination region 100E. FIG. 1B schematically illustrates the arrangement of these regions as viewed from a direction perpendicular to the main surface of silicon carbide substrate 101. As illustrated in FIG. 1B, termination region 100E surrounds active region 100A. Silicon carbide substrate 101 further includes scribe line region 100S located outside so as to surround termination region 100E. The scribe line region is a margin used when a wafer is diced and cut into chips, and no metal is disposed in this region.

Silicon carbide semiconductor device 201 includes a plurality of unit cells 100u located in active region 100A. The plurality of unit cells 100u each function as a metal-oxide-semiconductor field-effect transistor (MOSFET), and are connected in parallel to each other. In other words, unit cells 100u configure transistors, and thus silicon carbide semiconductor device 201 includes a plurality of transistors. When viewed from the direction perpendicular to the main surface of silicon carbide substrate 101, the plurality of unit cells 100u are arranged in a two-dimensional manner.

Each of unit cells 100u includes first conductivity type silicon carbide substrate 101, first conductivity type first silicon carbide semiconductor layer 102 disposed on silicon carbide substrate 101, second conductivity type first body region 103 selectively formed in a surface of first silicon carbide semiconductor layer 102, source region 104 selectively formed in a surface of first body region 103, gate insulating film 107 disposed above first silicon carbide semiconductor layer 102, and gate electrode 108 is disposed on gate insulating film 107. In the present exemplary embodiment, second silicon carbide semiconductor layer 106 is provided as a channel layer between first silicon carbide semiconductor layer 102 and gate insulating film 107.

In first silicon carbide semiconductor layer 102, source region 104 contains first conductivity type impurities (n$^+$ type) at a high concentration. For electrical connection to first body region 103, first contact region 105 of the second conductivity type containing second conductivity type impurities at a higher concentration than first body region 103 is provided in source region 104 so as to be in contact with first body region 103 under source region 104. Source electrode 109 which is electrically connected to source region 104 and first contact region 105 through an ohmic contact is provided on the surface of first silicon carbide semiconductor layer 102. Therefore, first body region 103 is electrically connected to source electrode 109 via first contact region 105.

First body region 103, source region 104, and first contact region 105 are formed with impurities ion implantation into first silicon carbide semiconductor layer 102, and a high-temperature annealing (activating annealing) process through which the impurities implanted into first silicon carbide semiconductor layer 102 are activated. Source electrode 109 can be formed, for example, by forming a layer made of a conductive material (e.g., Ni) on source region 104 and first contact region 105 in first silicon carbide semiconductor layer 102, and then performing an annealing at a high temperature.

Source region 104 and first silicon carbide semiconductor layer 102 are connected via second silicon carbide semiconductor layer 106. Second silicon carbide semiconductor layer 106 is a 4H—SiC layer formed on first silicon carbide semiconductor layer 102 through epitaxial growth, for example, and is doped with first conductivity type impurities. A thickness of second silicon carbide semiconductor layer 106 may be 75 nm or less, and a doping concentration may be $1 \times 10^{18}$ cm$^{-3}$ or higher, for example.

Second silicon carbide semiconductor layer 106 may have a two-layer structure including the first conductivity type impurity layer with the above-mentioned doping concentration and an undoped layer provided on the impurity layer. The thickness of second silicon carbide semiconductor layer 106 may be decreased due to formation of a sacrificial oxide film or a gate oxide film during a process of manufacturing silicon carbide semiconductor device 201. When an amount of decrease in the thickness of second silicon carbide semiconductor layer 106 varies, electric characteristics of silicon carbide semiconductor device 201 such as a forward threshold voltage or a reverse build-up voltage varies. According to the configuration in which second silicon carbide semiconductor layer 106 is provided with an undoped layer, even if the thickness of the undoped layer is mainly decreased due to the formation of a sacrificial oxide film or a gate oxide film, the impurity layer containing first conductivity type impurities remain intact, whereby the electric characteristics hardly vary.

Also, in addition to the two-layer structure described above, second silicon carbide semiconductor layer 106 may have a three-layer structure including a first conductivity type low-concentration impurity layer located on the side close to first silicon carbide semiconductor layer 102. For example, the doping concentration of the first conductivity type low-concentration impurity layer is $1 \times 10^{17}$ cm$^{-3}$ or less. The adoption of the structure described above enables a reduction in variation in an impurity concentration due to an unstable growth rate at the beginning of an epitaxial growth of second silicon carbide semiconductor layer 106.

Figure 3:
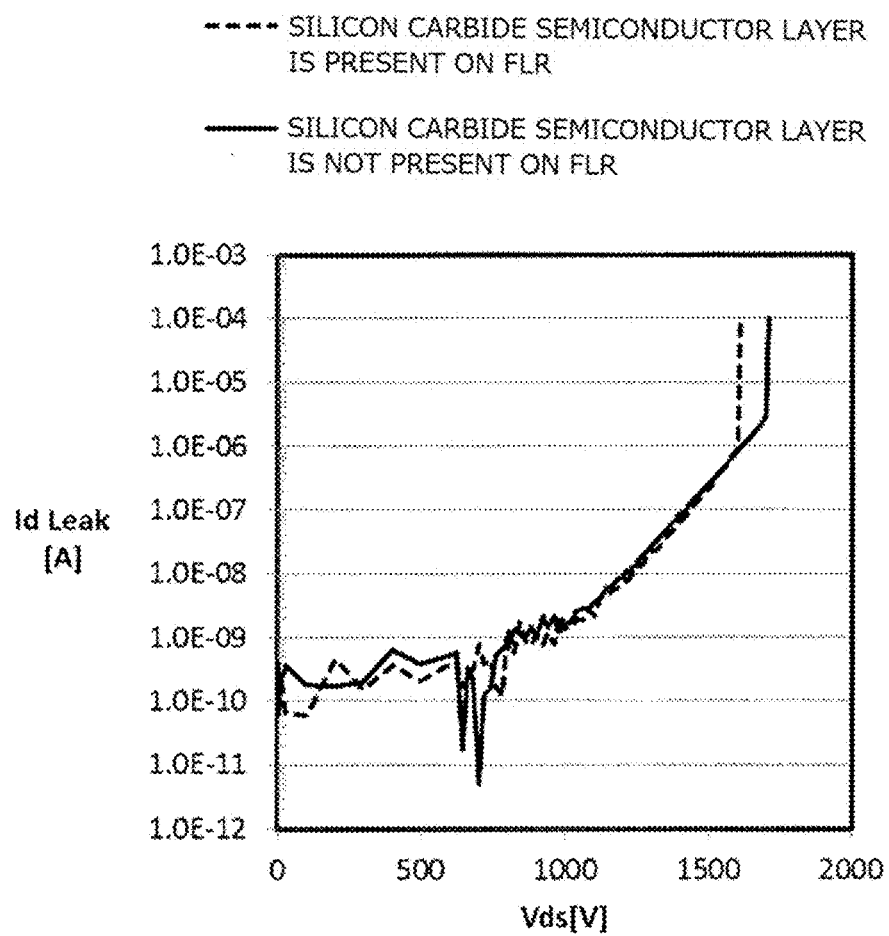
FIG. 3 is a graph showing a difference in OFF-leak characteristics depending on presence/absence of the second silicon carbide semiconductor layer on a field-limiting ring (FLR) region.

Second silicon carbide semiconductor layer 106 may not be provided on later-described FLR region 100F of the termination region. For example, it is preferable that, after second silicon carbide semiconductor layer 106 is formed on first silicon carbide semiconductor layer 102, second silicon carbide semiconductor layer 106 may be removed from FLR region 100F. Due to the second silicon carbide semiconductor layer having the first conductivity type, a region in contact with second conductivity type rings 120 is depleted to generate positive space charges. A depletion layer is unlikely to extend toward the first silicon carbide semiconductor layer from the rings on the FLR region due to the positive space charges, and thus, a breakdown voltage is reduced. FIG. 3 is a graph showing a difference in Id-Vd characteristics in an off state depending on presence/absence of the second silicon carbide semiconductor layer in FLR region 100F. It is found that a magnitude of a leakage current is almost the same, but a breakdown voltage becomes higher, when the second silicon carbide semiconductor layer is removed from FLR region 100F. The second silicon carbide semiconductor layer can be removed by dry etching, for example.

Source region 104 and first contact region 105 respectively form an ohmic contact together with source electrode 109. A transistor can be operated by applying a gate voltage to form an inversion layer, which is to serve as a channel, adjacent to a surface of first body region 103.

Gate insulating film 107 is, for example, a thermal oxide film ($SiO_2$ film) formed on a surface of second silicon carbide semiconductor layer 106 through thermal oxidation. Gate electrode 108 is made of conductive polysilicon, for example.

Interlayer dielectric film 111 is disposed on first silicon carbide semiconductor layer 102 or second silicon carbide semiconductor layer 106 to cover gate electrode 108 in active region 100A and termination region 100E, and gate insulating film 107 in termination region 100E, for example.

Therefore, gate electrode 108 is covered by interlayer dielectric film 111. In termination region 100E, the interlayer dielectric film disposed above second contact region 116. Interlayer dielectric film 111 is provided with openings 111c. Source electrode 109 in each of the unit cells is connected in parallel to upper source electrode (e.g., Al electrode) 112 through each of openings 111c. As described later, a part of upper source electrode 112 located in active region 100A and a portion of termination region 100E is referred to as inner-circumferential upper source electrode 112F.

Silicon carbide semiconductor device 201 has termination structure 100e at termination region 100E. Silicon carbide semiconductor has a dielectric breakdown field strength more than 10 times higher than that of Si. Therefore, in the silicon carbide semiconductor device, it is important to suppress a dielectric breakdown due to electric field concentration on a surface structure of the semiconductor device. Termination structure 100e reduces the electric field concentration on the surface of the semiconductor device. Unit cell 100u operating as a transistor is not provided in termination region 100E.

Termination structure 100e includes, at termination region 100E, silicon carbide substrate 101 and first silicon carbide semiconductor layer 102 disposed on the main surface of silicon carbide substrate 101. Termination structure 100e is selectively formed in a surface of first silicon carbide semiconductor layer 102, and includes second conductivity type second body region 115 surrounding active region 100A and second conductivity type second contact region 116 selectively formed in a surface of second body region 115. The concentration of second conductivity type impurities in the first body region is from $1\times10^{17}$ cm$^{-3}$ to $1\times10^{19}$ cm$^{-3}$, for example, and the concentration of second conductivity type impurities in the second body region is $1\times10^{19}$ cm$^{-3}$ to $1\times10^{21}$ cm$^{-3}$, for example. Similar to second body region 115, second contact region 116 also surrounds active region 100A. Second body region 115 may have an impurity concentration profile identical to an impurity concentration profile of first body region 103 in a depth direction. Similarly, second contact region 116 may have an impurity concentration profile identical to an impurity concentration profile of first contact region 105 in the depth direction. In other words, second body region 115 may be formed through a process identical to a process of forming first body region 103, and second contact region 116 may be formed through an identical process of forming first contact region 105.

Termination structure 100e is provided with a plurality of base electrodes including first base electrode 119a and a plurality of second base electrodes 119b and 119c. Base electrodes 119a, 119b, and 119c are formed on the surface of first silicon carbide semiconductor layer 102 so as to respectively come into contact with second contact region 116. First base electrode 119a located in an inner circumference (left in the figure) region, which is adjacent to active region 100A, of second contact region 116 in termination region 100E. FIG. 2C is a view illustrating semiconductor layers and electrodes disposed beneath the gate oxide film near the regions along 2A-2A' and 2B-2B' of the silicon carbide semiconductor device in FIG. 1A. Therefore, FIG. 2C does not illustrate the interlayer dielectric film, gate insulating film, upper electrodes, and gate electrode. As illustrated in FIG. 2C, each of first base electrodes 119a is formed in a form of an island on the surface of first silicon carbide semiconductor layer 102, and first base electrodes 119a are arranged similar to source electrode 109 in active region 100A, for example. On the other hand, second base electrodes 119b and 119c are located outside an outer periphery of later-described gate electrode 108, i.e., in an outer circumference (right in the figure) region of second contact region 116, to surround active region 100A. In other words, base electrodes 119b and 119c each have annular shapes, when viewed from the direction perpendicular to the main surface of silicon carbide substrate 101. In the present exemplary embodiment, termination structure 100e includes two second base electrodes 119b and 119c which have an annular shape. Second base electrode 119c located outside of active region 100A surrounds second base electrode 119b located inward of second base electrode 119c. A number of groups of annular-shaped second base electrodes may be one, or three or more. Base electrodes 119a, 119b, and 119c can be formed, for example, by forming a layer made of a conductive material (e.g., Ni) on second contact region 116 in first silicon carbide semiconductor layer 102, and then performing an annealing at a high temperature. Thus, base electrodes 119a, 119b, and 119c can be formed of a material same as the material of source electrode 109.

In termination region 100E, second silicon carbide semiconductor layer 106 and gate insulating film 107 are disposed on first silicon carbide semiconductor layer 102. In termination region 100E, gate electrode 108 is also disposed on gate insulating film 107 in order to provide the upper gate electrode. In addition, interlayer dielectric film 111 disposed so as to cover gate electrode 108. These components are continuous with the corresponding components in active region 100A.

Figure 2D:
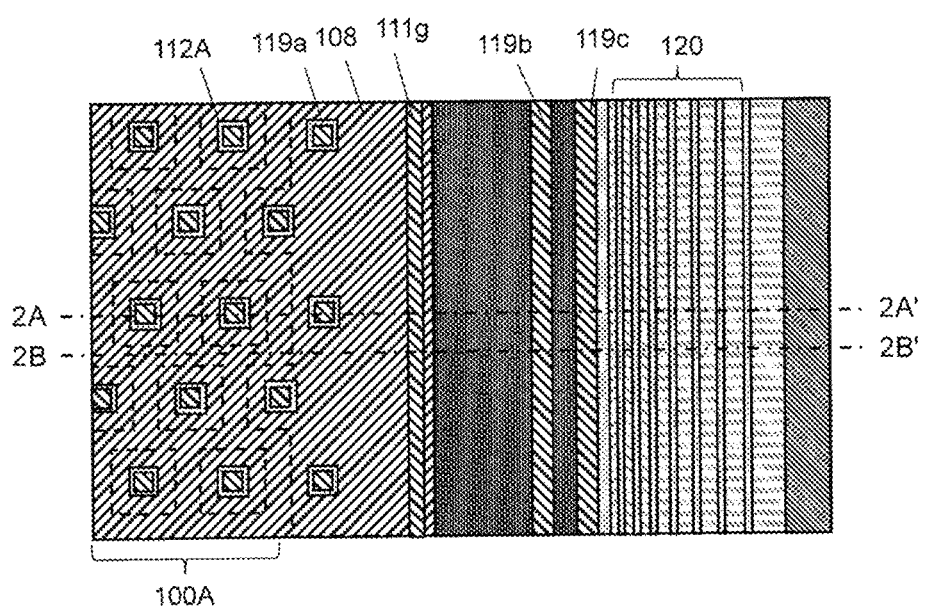
FIG. 2D is a plan view illustrating a gate electrode, near line 2A-2A' and line 2B-2B' in FIG. 1A, formed on a second silicon carbide semiconductor layer.

FIG. 2D is a view illustrating the positional relation among gate electrode 108 formed on second silicon carbide semiconductor layer 106 and the semiconductor layer, the source electrode and the base electrode beneath gate electrode 108 in the region in FIG. 2C. In active region 100A, gate electrode 108 is provided in a form of mesh on gate insulating film 107 except for source electrode 109 and base electrodes 119a. The gate electrodes between adjacent unit cells 100u are connected to each other. Therefore, as illustrated in FIGS. 2A and 2D, gate electrode 108 is divided at the position of source electrode 109 on the cross-section along line 2A-2A' crossing source electrode 109. On the other hand, as illustrated in FIGS. 2B and 2D, gate electrode 108 is continuous in active region 100A on the cross-section along line 2B-2B' not crossing source electrode 109.

Interlayer dielectric film 111 is provided with openings 111d, and base electrodes 119a, 119b, and 119c are connected to upper source electrode 112 through openings 111d. As described later, a part of upper source electrode 112 connected to annular second base electrodes 119b and 119c is referred to as outer-circumferential upper source electrode 112H. Outer-circumferential upper source electrode 112H has an annular shape corresponding to second base electrodes 119b and 119c. On the other hand, a part of upper source electrode 112 located in active region 100A and part 112a connected to first base electrode 119a are referred to as inner-circumferential upper source electrode 112F. In FIG. 2, outer-circumferential upper source electrodes 112Hb and 112Hc corresponding to second base electrodes 119b and 119c are located. In the present exemplary embodiment, outer-circumferential upper source electrodes 112Hb and 112Hc are connected to each other. However, outer-circumferential upper source electrodes 112Hb and 112Hc may be separated from each other. That is, the termination structure has one or more outer-circumferential upper source electrodes 112H. When one outer-circumferential upper source electrode 112H is provided, outermost outer-circumferential upper source electrode 112H indicates this one outer-circumferential upper source electrode 112H.

Similarly, the interlayer dielectric film is provided with opening 111g, and gate electrode 108 is connected to upper gate electrode 114 through opening 111g. Upper gate electrode 114 is an Al electrode, for example, and can be formed by a process same as the process for upper source electrode 112.

Termination structure 100e is located on the surface of first silicon carbide semiconductor layer 102, and includes at least one second conductivity type ring 120 in FLR region 100F surrounding second body region 115. The first silicon carbide semiconductor layer is made of n-type silicon carbide with an impurity concentration of $1 \times 10^{15}$ cm$^{-3}$ to $1 \times 10^{16}$ cm$^{-3}$, for example, and the second conductivity type ring is made of p-type silicon carbide with an impurity concentration of $1 \times 10^{17}$ cm$^{-3}$ to $1 \times 10^{19}$ cm$^{-3}$. The second conductivity type ring is generally selectively formed on the surface of the first silicon carbide semiconductor layer by ion implantation, and may have an impurity concentration same as that of the first body region in the unit cell and the second body region in the termination region. In this case, the ring may simultaneously be formed by the same ion implantation process. As viewed from the direction perpendicular to the surface of silicon carbide substrate 101, p-type ring 120 has a ring shape so as to surround second body region 115 located outside active region 100A. In the present exemplary embodiment, a plurality of rings 120 are provided to form the FLR structure. Specifically, as viewed from the direction perpendicular to the surface of silicon carbide substrate 101, each of the plurality of rings 120 has a ring shape surrounding active region 100A, and the plurality of rings 120 have a nested structure as a whole. That is, outer ring 120 surrounds inner ring 120.

Each of the rings also has a rectangular shape with rounded four corners as viewed from the direction perpendicular to the surface of silicon carbide substrate 101. Due to the rounded four corners of the ring, concentration of an electric field on four corners can be prevented. For example, ring 120 may have an impurity concentration profile identical to an impurity concentration profile of each of first body region 103 and second body region 115 in active region 100A in the depth direction.

Figure 1C:
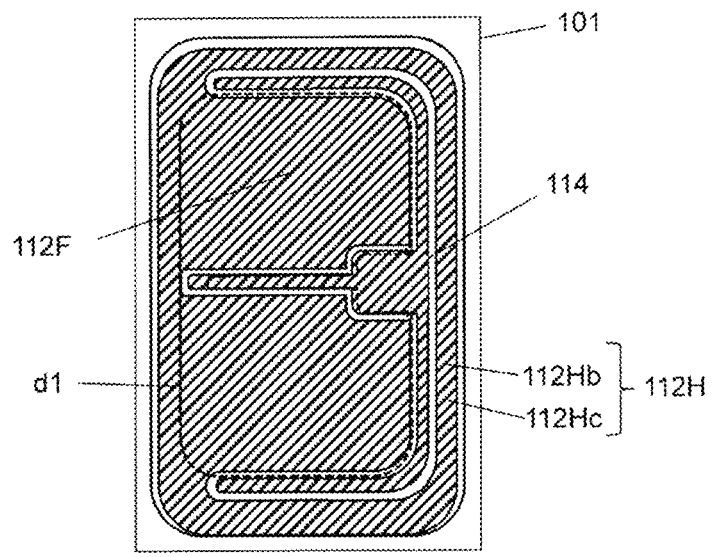
FIG. 1C is a plan view illustrating an upper source electrode and an upper gate electrode of the silicon carbide semiconductor device illustrated in FIG. 1A.

FIG. 1C is a plan view illustrating upper source electrode 112 and upper gate electrode 114 as viewed from the main surface of silicon carbide substrate 101. Dotted line dl indicates the border between inner-circumferential upper source electrode 112F and outer-circumferential upper source electrode 112H. The part of upper source electrode 112 located within the region indicated by dotted line dl is inner-circumferential upper source electrode 112F, and the part located outside of the region indicated by dotted line dl is outer-circumferential upper source electrode 112H. Inner-circumferential upper source electrode 112F and outer-circumferential upper source electrode 112H are connected to each other, and electrically connected to each other. As illustrated in FIG. 1C, outer-circumferential upper source electrodes 112Hb and 112Hc are located outside of upper gate electrode 114, and upper gate electrode 114 is located between inner-circumferential upper source electrode 112F and outer-circumferential upper source electrode 112H. In the present exemplary embodiment, outer-circumferential upper source electrode 112Hb and outer-circumferential upper source electrode 112Hc constitute outer-circumferential upper source electrode 112H.

Figure 1D:
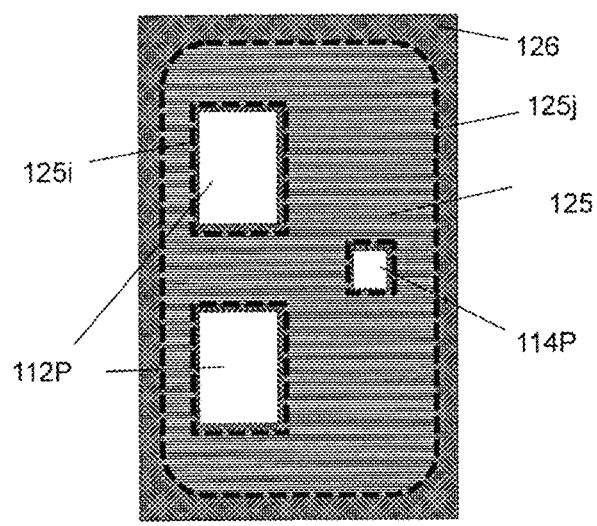
FIG. 1D is a plan view illustrating a first protective film and a second protective film of the silicon carbide semiconductor device illustrated in FIG. 1A.

Silicon carbide semiconductor device 201 includes first protective film 125 and second protective film 126 for protecting the internal structure from an external environment. FIG. 1D is a plan view illustrating second protective film 126 as viewed from the main surface of silicon carbide substrate 101. In FIG. 1D, a contour of first protective film 125 is indicated by a bold dotted line. As illustrated in FIGS. 1A, 1D, 2A, and 2B, first protective film 125 covers entire inner-circumferential upper source electrode 112F, entire upper gate electrode 114, and at least entire inner surface 112Hi of outer-circumferential upper source electrode 112H in active region 100A and termination region 100E except for pad regions 112P and 114P. When a plurality of outer-circumferential upper source electrodes 112H are formed, first protective film 125 covers entire inner-circumferential upper source electrode 112F, entire upper gate electrode 114, and entire inner surface 112Hi of outermost outer-circumferential upper source electrode 112H. The pad region herein indicates a region of inner-circumferential upper source electrode or upper gate electrode where a wire or a ribbon is connected for connection to a terminal of a package, and the protective film is open in the pad region. In the present exemplary embodiment, first protective film 125 covers inner side surface 112Hi and outer side surface 112Hj of outer-circumferential upper source electrode 112H. That is, first protective film 125 covers outer-circumferential upper source electrode 112H. In this case, it is preferable that first protective film 125 does not cover at least outermost ring 120. That is, outer side surface 125j of first protective film 125 is positioned in second body region 115 between outermost outer-circumferential upper source electrode 112H among a plurality of outer-circumferential upper source electrodes 112H and rings 120. In other words, first protective film 125 does not cover the outermost ring 120 in the present exemplary embodiment.

Second protective film 126 covers first protective film 125 and at least a part of rings 120, in active region 100A and termination region 100E. Preferably, second protective film 126 covers the main surface of silicon carbide substrate 101 except for scribe line region 100S. Since first protective film 125 does not located in pad regions 112P and 114P, second protective film 126 covers inner side surface 125i of first protective film 125 in pad regions 112P and 114P so as to expose pad regions 112P and 114P. In the present exemplary embodiment, inner-circumferential upper source electrode 112F, upper gate electrode 114, and outer-circumferential upper source electrode 112H are not in direct contact with second protective film 126.

First protective film 125 is preferably made of a dense inorganic material. Specifically, first protective film 125 is made of silicon nitride. A silicon nitride film is dense, and has excellent barrier property against moisture. Particularly, a silicon nitride film formed by a plasma CVD method can preferably be used as the first protective film. First protective film 125 has a thickness of, for example, 0.2 μm to 2 μm, inclusive.

On the other hand, second protective film 126 is preferably made of an organic material. For example, second protective film 126 is made of a polyimide resin, polybenzoxazole resin, acrylic resin, or the like. Second protective film 126 has a thickness of, for example, 3 μm to 20 μm, inclusive.

First protective film 125 can be formed, for example, in such a way that, after upper source electrode 112 and upper gate electrode 114 are formed, a silicon nitride film is formed by a plasma CVD method, and then, the silicon nitride film is patterned so that pad regions 112P and 114P are exposed. Second protective film 126 can be formed, for example, in such way that, after first protective film 125 is formed, the above-mentioned organic material is applied or spin coated on a wafer, on which a plurality of silicon carbide semiconductor devices 201 are formed, to form a film of the organic material, and then, the organic material film is patterned so that pad regions 112P and 114P and scribe line region 100S are exposed. Alternatively, second protective film 126 on scribe line region 100S may be removed by a dicing blade or the like.

Silicon carbide semiconductor device 201 can be manufactured in a procedure same as the procedure of manufacturing a general semiconductor device by using element technologies in the manufacture of semiconductor devices stated in the description of each constituent.

In silicon carbide semiconductor device 201 having the above configuration, first protective film 125 covers inner-circumferential upper source electrode 112F and upper gate electrode 114 except for pad regions 112P and 114P, so as to cover inner side surface 112Hi of outer-circumferential upper source electrode 112H is positioned in termination region 100E surrounding active region 100A.

Further, outer-circumferential upper source electrode 112H penetrates through interlayer dielectric film 111 from above interlayer dielectric film 111 to be connected to base electrode 119 disposed on second contact region 116 in first silicon carbide semiconductor layer 102. That is, outer-circumferential upper source electrode 112H is a continuous single structure reaching first silicon carbide semiconductor layer 102 from the top surface of interlayer dielectric film 111. In general, a semiconductor device is formed by stacking a thin-film structure, and thus, water or the like easily intrudes between thin-film layers from outside. Regarding this point, outer-circumferential upper source electrode 112H is continuous from first silicon carbide semiconductor layer 102 to the top surface of interlayer dielectric film 111 in the direction perpendicular to the main surface of silicon carbide substrate 101, and continuously surrounds active region 100A, thereby sealing active region 100A from the side.

Accordingly, the plurality of unit cells 100u, inner-circumferential upper source electrode 112F, and upper gate electrode 114 in active region 100A which are inward from outer-circumferential upper source electrode 112H are effectively sealed by a combination of outer-circumferential upper source electrode 112H and first protective film 125. The silicon carbide semiconductor device may have one base electrode located on the outer circumference of the second body region, one opening connected to the base electrode and formed on the interlayer dielectric film, and one outer-circumferential upper source electrode 112Hb or 112Hc embedded in the opening, but it is more effective if the device has a plurality of base electrodes, openings, and outer-circumferential upper source electrodes. Outer-circumferential upper source electrode 112H according to the present exemplary embodiment is connected to first silicon carbide semiconductor layer 102 through base electrode 119 (119b, 119c) at plural portions. Therefore, the sealing structure is multiplexed, whereby a high sealing effect can be obtained. Specifically, silicon nitride constituting first protective film 125 and the metal constituting electrodes have excellent barrier property against moisture. Therefore, the formation of first protective film 125 in the above-mentioned region can effectively prevent the intrusion of moisture into silicon carbide semiconductor device 201.

On the other hand, second protective film 126 covers first protective film 125, and is formed on the entire main surface of silicon carbide semiconductor device 201 except for scribe line region 100S and pad regions 112P and 114P. Second protective film 126 is made of an organic material, which has lower barrier property against moisture as compared to silicon nitride. However, the hardness of the organic material is lower than that of silicon nitride, so that, even if stress is externally applied, second protective film 126 is unlikely to break or crack and is also unlikely to rise or peel.

Therefore, even if stress is applied particularly to FLR region 100F due to a mold resin being cured when silicon carbide semiconductor device 201 is stored in a package, generation of cracks in second protective film 126 or rising of second protective film 126 can be suppressed in FLR region 100F. As described later, even if a two-layer structure including first protective film 125 and second protective film 126 is formed in FLR region 100F, first protective film 125 may crack or rise.

An electric field from first silicon carbide semiconductor layer 102 leaks on the surface of FLR region 100F. The cracked or rising region is filled with air. The dielectric breakdown field of air is lower than that of first protective film 125 and second protective film 126, so that a leakage current is likely to flow in the cracked or rising region due to the leakage electric field from first silicon carbide semiconductor layer 102. In addition, moisture intruding into the cracked or rising region may also cause a leakage current. On the other hand, silicon carbide semiconductor device 201 does not have first protective film 125 in FLR region 100F, thereby being capable of suppressing degradation in reliability due to cracks or the like caused in first protective film 125.

As described above, silicon carbide semiconductor device 201 according to the present exemplary embodiment not only merely includes first protective film 125 and second protective film 126 but also implements a high watertight structure according to outer-circumferential upper source electrode 112H in termination region 100E and an appropriate spatial layout of outer-circumferential upper source electrode 112H, first protective film 125, and second protective film 126.

On the other hand, the semiconductor device disclosed in Unexamined Japanese Patent Publication No. 2014-138090 has a structure in which a two-layer structure of an inorganic protective film and an organic protective film covers the entire semiconductor device or a structure in which an inorganic protective film covers only a gate metal wiring and a source electrode pad, and an organic protective film covers the entire semiconductor device. This semiconductor device does not have a combination of a structure of penetrating through an interlayer dielectric film and an inorganic protective film in a termination structure. That is, Unexamined Japanese Patent Publication No. 2014-138090 only discloses that the gate metal wiring and the source electrode pad are individually covered by the inorganic protective film, and does not disclose or suggest the structure for protecting the entire semiconductor device in a watertight manner using an inorganic protective film.

In addition, silicon carbide semiconductor device 201 enables a charging/discharging current generated in the depletion layer during high-speed switching to flow through the upper source electrode, thereby being capable of preventing a potential rise in second body region 115 and breakdown of gate insulating film 107 caused by the potential rise. This feature will be described below.

Generally, when a load is connected in serial with silicon carbide semiconductor device in an inverter circuit, for example, and a current is flowing through the load due to a gate of the silicon carbide semiconductor device being turned on, a voltage is generated across both ends of the load. Therefore, power supply voltage Vcc is distributed to the silicon carbide semiconductor device and the load. When the gate of the silicon carbide semiconductor device is turned off, a current does not flow, so that voltage is not generated across the load, and power supply voltage Vcc is entirely applied to the silicon carbide semiconductor device. In other words, Vcc is applied to a drain of the silicon carbide semiconductor device. In this case, a pn junction formed by a body region in each unit cell in an active region and a first silicon carbide semiconductor layer (drift region) of the silicon carbide semiconductor device and a pn junction formed by the body region and the first silicon carbide semiconductor layer in a termination region are reversely biased, so that a depletion layer extends to both sides of the body region and the first silicon carbide semiconductor layer. Due to the extension of the depletion layer, holes flow toward the outside and a negative space charge layer is formed in the body region (p-type semiconductor region). In the first silicon carbide semiconductor layer (n-type semiconductor region), electrons flow toward the outside and a positive space charge layer is formed. Therefore, when the silicon carbide semiconductor device is turned to an OFF state from an ON state, a charging current flows with the depletion layer being a capacitor, and when the silicon carbide semiconductor device is turned to an ON state from an OFF state, electric charges charged in the depletion layer flow in the reverse direction as a discharging current.

Charge q of the depletion layer is represented by following equation (1). In this equation, C is a capacitance of the depletion layer, and V is a reverse bias voltage applied to the pn junction.

$$q = CV \tag{1}$$

When both sides are differentiated, charging/discharging current I is obtained as indicated by following equation (2).

$$I = dq/dt = C \cdot dV/dt \tag{2}$$

Therefore, as dV/dt in equation (2) becomes larger, i.e., as the switching speed becomes higher, the charging/discharging current becomes larger. Conversely, unless the charging/discharging current is large, high-speed switching of MOSFET cannot be implemented.

Figure 4A:
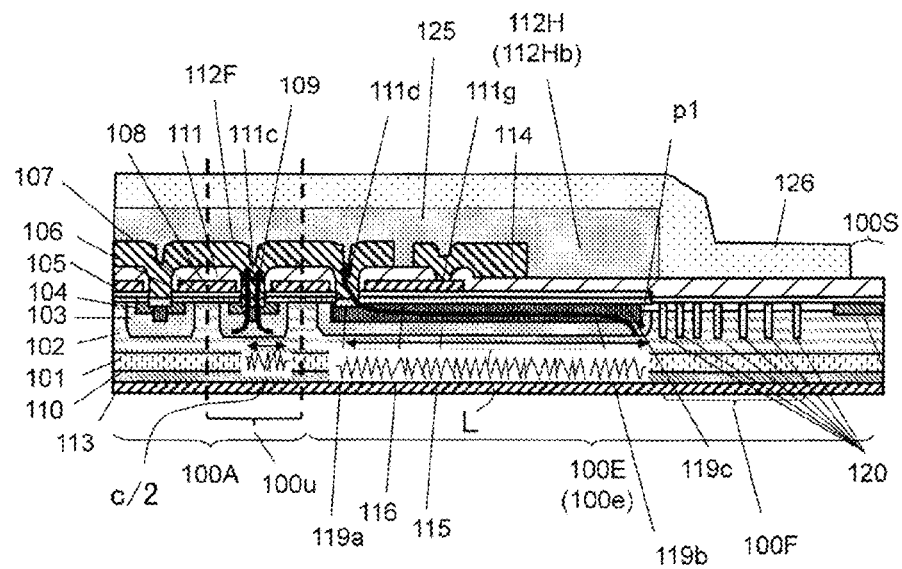
FIG. 4A is a view for describing a path of a charging current flowing through first and second body regions when the silicon carbide semiconductor device is turned to an off state from an on state.

As described above, the silicon carbide semiconductor device has the pn junction in the active region and the pn junction in the termination region. FIG. 4A illustrates a path of a charging current flowing through body regions when the silicon carbide semiconductor device is turned to an OFF state from an ON state. Generally, the resistance of the body region formed by implanting or diffusing impurities into the silicon carbide semiconductor layer is relatively high. Therefore, when a charging current flows, a potential rise determined by a product of the current and the resistance of the current path (contact resistance of the electrode+resistance of the body region) occurs in the body region. When the current path in the body region is increased, the resistance of the current path is also increased. Thus, as the body region is larger, the generated potential becomes higher. As the result, an excessive voltage is applied to the gate insulating film sandwiched between the body region and the gate electrode, which may lead to breakdown of the gate insulating film.

The size of the unit cell in the active region is generally from 5 μm to 10 μm, inclusive, and thus, the body region is small. Therefore, the capacitance of the depletion layer is small, and the charging current is also low. Further, because of the current path being short and the resistance being small, the generation of a charging current and the potential rise in the body region due to ON-OFF of the silicon carbide semiconductor device do not matter in most cases. On the other hand, the body region located in the termination region generally has a size of several ten μm, so that the charging current is high and the current path is long. Therefore, the potential rise in the body region is large, and the possibility of breakdown of the gate insulating film is higher than that in the active region. Particularly when the silicon carbide semiconductor device performs high-speed switching, breakdown of the gate insulating film is likely to occur.

In the structure illustrated in FIG. 4A, only base electrode 119a adjacent to active region 100A in the form of islands is present in second contact region 116 in second body region 115 in termination region 100E. Therefore, outside position p1 of second body region 115 farthest from base electrode 119a has the highest potential. The path for the charging current due to the pn junction from position p1 to base electrode 119a is equal to full length L of annular second body region 115, so that this path has a high resistance and high voltage.

Figure 4B:
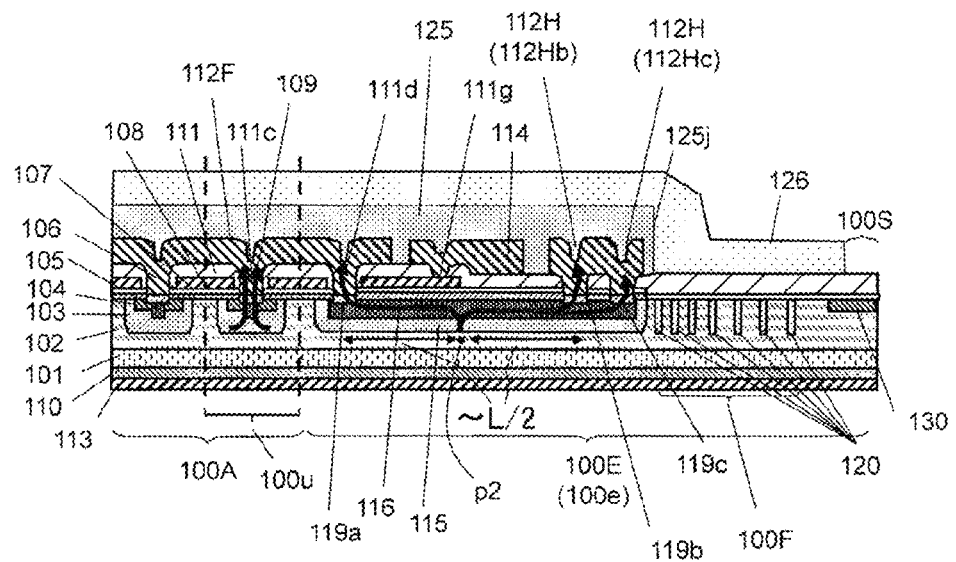
FIG. 4B is a view for describing a path of a charging current flowing through first and second body regions when the silicon carbide semiconductor device according to the first exemplary embodiment is turned to an off state from an on state.

On the other hand, as illustrated in FIG. 4B, in silicon carbide semiconductor device 201 according to the present exemplary embodiment, termination structure 100e has, in annular second body region 115 surrounding active region 100A, first base electrode 119a disposed at the inner circumferential side adjacent to active region 100A, and second base electrodes 119b and 119c disposed at the outer circumferential side. First base electrode 119a is connected to inner-circumferential upper source electrode 112F, and second base electrodes 119b and 119c are connected to outer-circumferential upper source electrode 112H. Therefore, on the cross-section crossing the annular shape of second body region 115, the potential is the highest, due to the charging current, at position p2 in almost the middle between base electrode 119a and base electrodes 119b and 119c. At position p2, the charging current caused by the pn junction between second body region 115 and first silicon carbide semiconductor layer 102 flows from first base electrode 119a or second base electrodes 119b and 119c toward inner-circumferential upper source electrode 112F or outer-circumferential upper source electrode 112H through a path with a length of about L/2. That is, the distance from first base electrode 119a or second base electrodes 119b and 119c serving as a ground potential to position p2 which is the farthest from first base electrode 119a or second base electrodes 119b and 119c in second body region 115 is only L/2. Specifically, the potential rise at position p2 in silicon carbide semiconductor device 201 in FIG. 4B can be reduced to about half of the potential rise at position p1 in FIG. 4A. Therefore, silicon carbide semiconductor device 201 provides an effect that breakdown of the gate insulating film is hardly caused even when silicon carbide semiconductor device 201 is operated at high speed.

Second Exemplary Embodiment

Figure 5A:
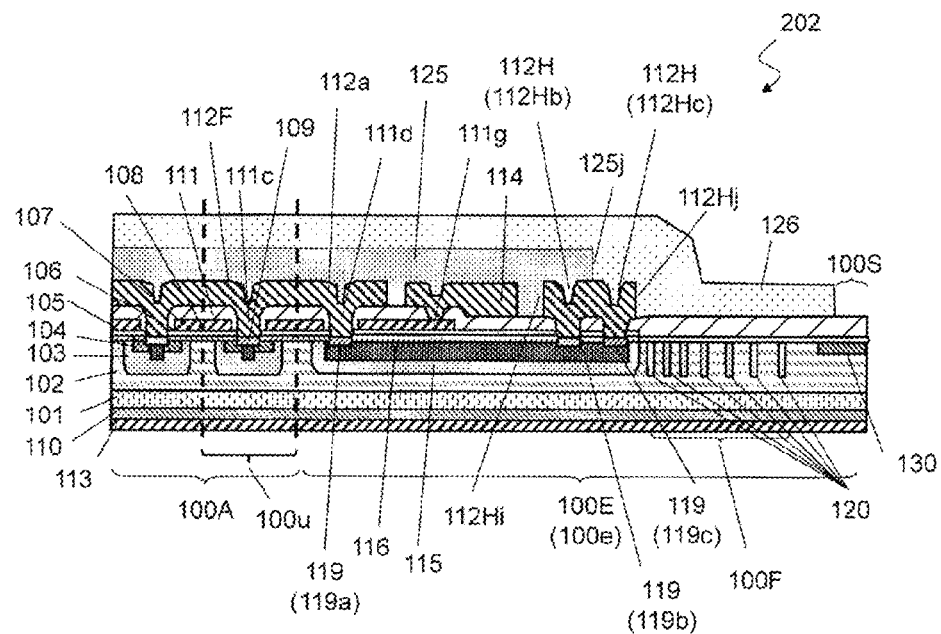
FIG. 5A is a sectional view illustrating a silicon carbide semiconductor device, according to a second exemplary embodiment, taken along line 2A-2A' in FIG. 1A.
Figure 5B:
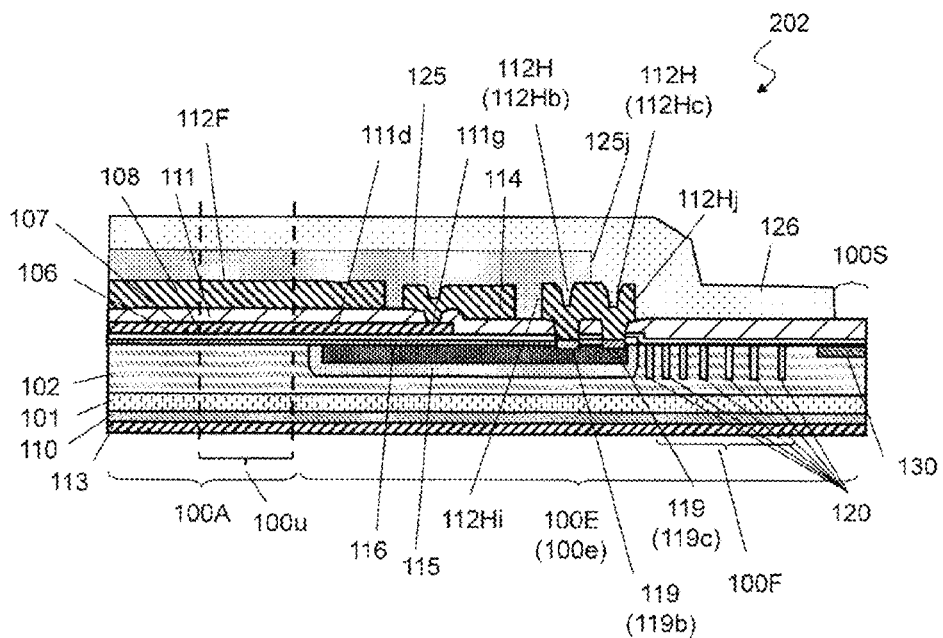
FIG. 5B is a sectional view illustrating the silicon carbide semiconductor device, according to the second exemplary embodiment, taken along line 2B-2B' in FIG. 1A.

A silicon carbide semiconductor device according to a second exemplary embodiment of the present disclosure will now be described. FIGS. 5A and 5B are each a sectional view of silicon carbide semiconductor device 202, according to the present exemplary embodiment, taken along line 2A-2A' and line 2B-2B' in FIG. 1A.

Silicon carbide semiconductor device 202 is different from silicon carbide semiconductor device 201 in the first exemplary embodiment in that outer side surface 112Hj of outermost outer-circumferential upper source electrode 112Hc among one or more outer-circumferential upper source electrodes 112H is not covered by first protective film 125.

Inner side surface 112Hi of outer-circumferential upper source electrode 112Hb or 112Hc positioned outside of upper gate electrode 114 is entirely covered by first protective film 125, but outer side surface 112Hj of outermost outer-circumferential upper source electrode 112Hc is not covered by first protective film 125. Outer side surface 125j of first protective film 125 is positioned on outermost outer-circumferential upper source electrode 112H. Therefore, outer side surface 112Hj is in contact with second protective film 126.

As described later, it has been found that, due to curing of a mold resin described above, a large stress is applied to the vicinity of outer side surface 112Hj of outermost outer-circumferential upper source electrode 112Hc among outer-circumferential upper source electrodes 112H. Further, an internal stress of first protective film 125 is likely to be increased at an edge. It has been found that cracks are likely to occur particularly in an externally upper side of outer-circumferential upper source electrode 112Hc. Silicon carbide semiconductor device 202 is configured such that the vicinity of outer side surface 112Hj of outer-circumferential upper source electrode 112Hc is covered only by second protective film 126 without being covered by first protective film 125, whereby the vicinity of outer side surface 112Hj can be protected by second protective film 126 resistant to stress with first protective film 125 being prevented from cracking, for example, due to stress applied when the molding resin is cured.

As in the first exemplary embodiment, first protective film 125 covers inner-circumferential upper source electrode 112F and upper gate electrode 114, except for pad regions 112P and 114P, so as to cover entire inner surface 112Hi of outer-circumferential upper source electrode 112H located in termination region 100E surrounding active region 100A. Therefore, as described in the first exemplary embodiment, active region 100A can effectively be sealed by inner-circumferential upper source electrode 112F, first protective film 125, and outer-circumferential upper source electrode 112H. Accordingly, silicon carbide semiconductor device 202 can provide an effect of effectively preventing first protective film 125 from cracking, for example, to improve reliability, in addition to the effect of silicon carbide semiconductor device 201 in the first exemplary embodiment.

Third Exemplary Embodiment

Figure 6A:
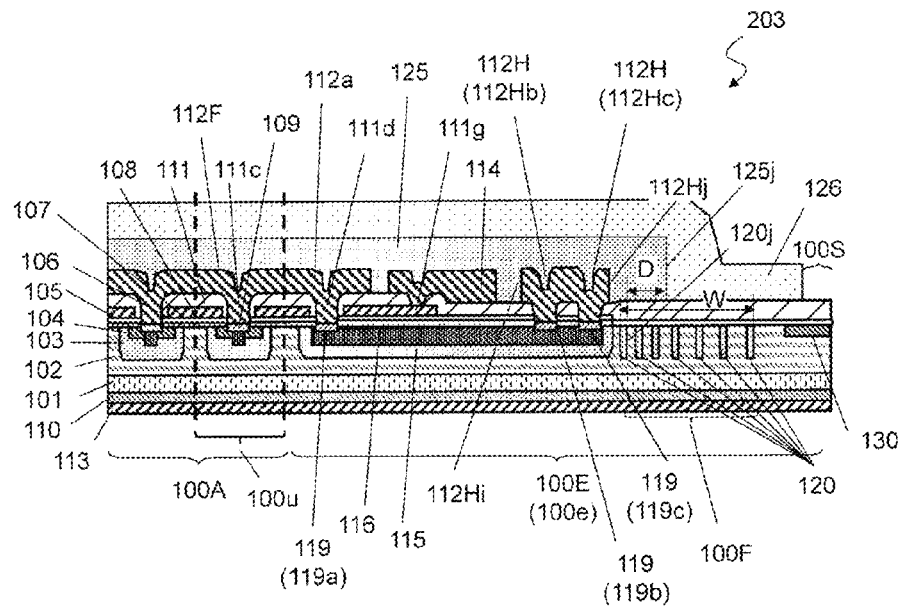
FIG. 6A is a sectional view illustrating a silicon carbide semiconductor device, according to a third exemplary embodiment, taken along line 2A-2A' in FIG. 1A.
Figure 6B:
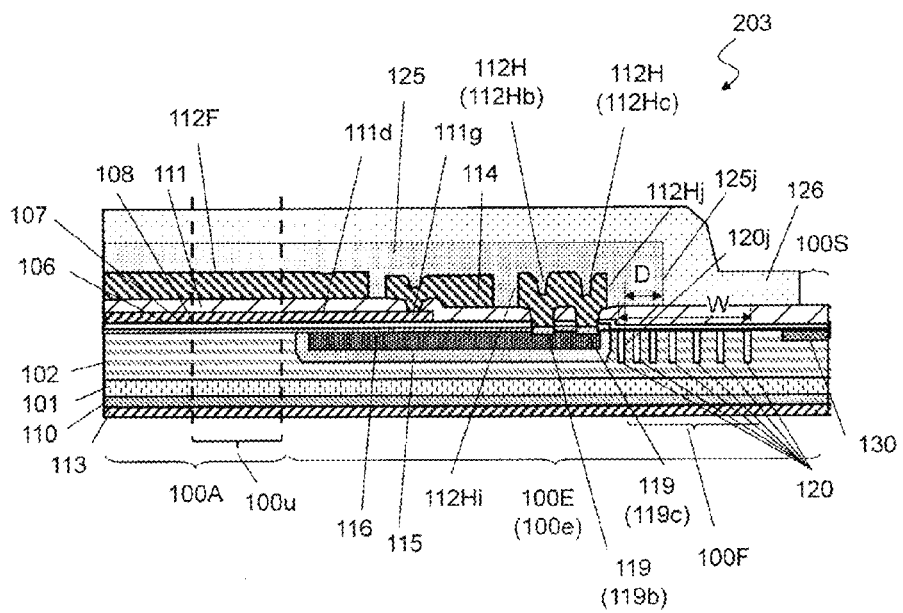
FIG. 6B is a sectional view illustrating the silicon carbide semiconductor device, according to the third exemplary embodiment, taken along line 2B-2B' in FIG. 1A.

A silicon carbide semiconductor device according to a third exemplary embodiment of the present disclosure will now be described. FIGS. 6A and 6B are each a sectional view illustrating silicon carbide semiconductor device 203, according to the present exemplary embodiment, taken along line 2A-2A' and line 2B-2B' in FIG. 1A.

Silicon carbide semiconductor device 203 is different from silicon carbide semiconductor device 201 in the first exemplary embodiment and silicon carbide semiconductor device 202 in the second exemplary embodiment in that first protective film 125 covers at least innermost ring 120 among the plurality of rings 120.

As illustrated in FIGS. 6A and 6B, first protective film 125 covers inner-circumferential upper source electrode 112F, upper gate electrode 114, and at least innermost ring 120 among the plurality of rings 120 in active region 100A and termination region 100E except for pad regions 112P and 114P. That is, first protective film 125 extends toward the outer circumferential side from active region 100A to at least innermost ring 120 except for pad regions 112P and 114P. In the present exemplary embodiment, first protective film 125 covers a plurality of rings 120 including innermost ring 120. First protective film 125 does not cover at least outermost ring 120. That is, first protective film 125 only covers some inner rings 120 among a plurality of rings.

When the inventor of the present application simulated an electric field in FLR region 100F, an electric field was increased at an outer circumferential edge of each ring in FLR region 100F. The electric field at the outer circumferential edge of the innermost ring was particularly the highest, and the electric field was almost at the same level, although slightly lower than the highest electric field, for the second ring from the inner side to the ring at almost the center of FLR region 100F. The electric field was lower on the outer rings than on the inner rings relative to almost the center of the FLR region, and it was found that the electric field was gradually decreased toward the outside.

When a reverse bias is applied to the silicon carbide semiconductor device, the largest electric field is structurally applied to the innermost ring among the plurality of rings. On the other hand, the second protective film is made of an organic material such as a resin, and depending on the type of organic materials, second protective film 126 may include mobile ions. In addition, an organic resin constituting second protective film 126 is less dense than silicon nitride constituting first protective film 125, and thus, mobile ions and moisture are likely to intrude from the outside. In this case, with the silicon carbide semiconductor device being stored at high temperature and being applied with a reverse bias, mobile ions intruding into second protective film 126 move according to the leakage electric field from the semiconductor layer and move to the vicinity of the innermost ring, to thereby change the shape of the depletion layer in FLR region 100F and increase a drain leakage current during the application of the reverse bias. The intrusion and movement of mobile ions are more likely to occur at high temperature. Therefore, when the silicon carbide semiconductor device is particularly stored at high temperature and under a reverse bias, a drain leakage current is likely to rise. Specifically, the rise in the drain leakage current due to the above-mentioned cause is more likely to occur in a high temperature reverse bias (HTRB) test conducted in the atmosphere at a temperature of 150° C. to 200° C. than in a temperature humidity bias (THB) test at a temperature of 85° C. and humidity of 85%.

On the other hand, because silicon nitride is a dense material, intrusion of mobile ions into first protective film 125 and movement of mobile ions in first protective film 125 hardly occur.

Accordingly, in silicon carbide semiconductor device 203 in the present exemplary embodiment, first protective film 125 covers at least innermost ring 120, whereby, in the above-mentioned case, the accumulation of mobile ions near innermost ring 120 can be suppressed to prevent the generation of the leakage path during the application of the reverse bias.

However, if innermost ring 120 is only covered by first protective film 125, mobile ions may move to the vicinity of second ring 120 from the inner side which is not covered by first protective film 125, which may lead to the formation of the leakage path during the application of the reverse bias. Therefore, it is preferable that first protective film 125 covers a plurality of rings 120 including innermost ring 120. FIGS. 6A and 6B illustrate that first protective film 125 covers three rings 120. For example, when termination structure 100e of a silicon carbide semiconductor device actually manufactured has twenty-five rings, first protective film 125 may cover about ten rings. According to this structure, the effect of mobile ions can more reliably be prevented, and the reliability of the silicon carbide semiconductor device when being stored at high temperature and under a reverse bias can be improved.

When only innermost ring 120 is covered by first protective film 125, a margin for the position of outer side surface 125j of first protective film 125 during the manufacture of the silicon carbide semiconductor device is small. This may result in manufacture of a silicon carbide semiconductor device in which first protective film 125 does not cover innermost ring 120 due to misalignment, and the reliability may be significantly degraded. On the other hand, according to a silicon carbide semiconductor device including first protective film 125 covering a plurality of rings 120, even if the position of outer side surface 125j of first protective film 125 is displaced due to positional misalignment, innermost ring 120 can reliably be covered by first protective film 125. Therefore, this configuration can contribute to enhance a production yield of the silicon carbide semiconductor device.

As previously described in the second exemplary embodiment, regarding a stress, it may be preferable that the vicinity of outer side surface 112Hj of outer-circumferential upper source electrode 112Hc is not covered by first protective film 125. Therefore, the position of outer side surface 125j of first protective film 125 may be determined according to characteristics required for the silicon carbide semiconductor device.

For example, on a cross-section perpendicular to the direction in which rings 120 extend, width W of a region where the plurality of rings 120 are provided is from 60 μm to 120 μm, inclusive, and on this cross-section, distance D from outer side surface 120j of innermost ring 120 to outer side surface 125j of first protective film 125 is from 18 μm to 50 μm inclusive. Herein, width W is defined by a distance between the inner surface of innermost ring 120 to the outer surface of outermost ring 120.

Fourth Exemplary Embodiment

Figure 7A:
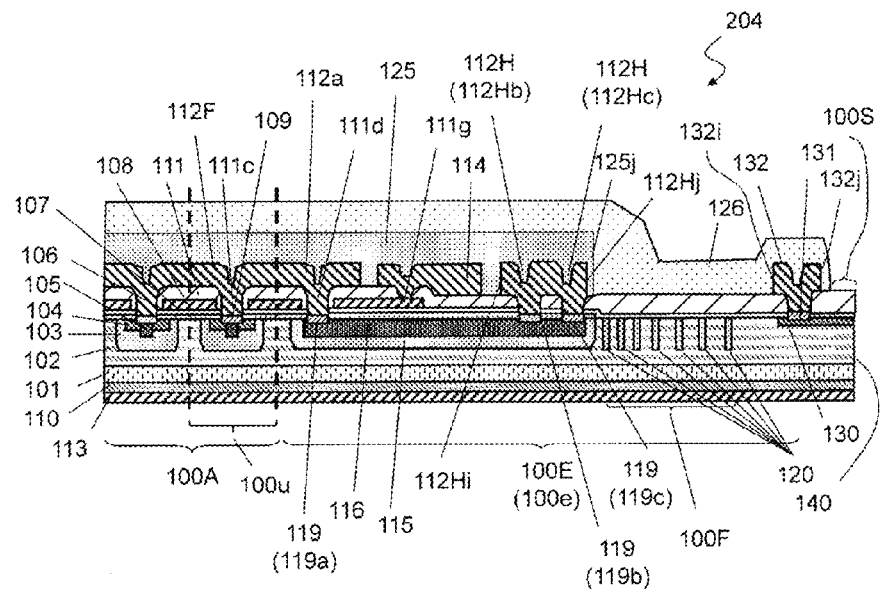
FIG. 7A is a sectional view illustrating a silicon carbide semiconductor device, according to a fourth exemplary embodiment, taken along line 2A-2A' in FIG. 1A.

A silicon carbide semiconductor device according to a fourth exemplary embodiment of the present disclosure will now be described. FIG. 7A is a sectional view illustrating silicon carbide semiconductor device 204, according to the present exemplary embodiment, taken along line 2A-2A' in FIG. 1A.

Silicon carbide semiconductor device 204 is different from silicon carbide semiconductor device 201 in the first exemplary embodiment in that silicon carbide semiconductor device 204 further includes, on the surface of first silicon carbide semiconductor layer 102, high-concentration first conductivity type third contact region 130 located outside FLR region 100F and selectively formed so as to surround FLR region 100F, base electrode (third base electrode) 131 connected to third contact region 130, and seal electrode 132 connected to base electrode 131 and surrounding the rings. Second protective film 126 entirely covers seal electrode 132. For example, third contact region 130, base electrode 131, and seal electrode 132 can be formed simultaneously with source region 104, source electrode 109, and inner-circumferential upper source electrode 112F in active region 100A, respectively.

Third contact region 130 is provided not to form an ohmic contact with first silicon carbide semiconductor layer 102 but to function as a so-called channel stop region. A mechanical defect is caused on side wall 140 on the end of the chip formed by dicing. If the depletion layer extending in first silicon carbide semiconductor layer 102 from rings 120 to the outside of the chip reaches side wall 140 on the chip end, a drain leakage current may be generated. Setting the concentration of the first conductivity type impurities in third contact region 130 to be one or more digits higher than that of first silicon carbide semiconductor layer 102 makes the depletion layer difficult to extend in third contact region 130. Therefore, the generation of the drain leakage current due to the depletion layer reaching side wall 140 on the chip end can be suppressed.

In addition, even if an expansion stress which may be caused during curing of second protective film 126 due to a contraction stress or thermal expansion is caused, contraction and expansion of second protective film 126 can be suppressed by the engagement between inner side surface 132i or outer side surface 132j of seal electrode 132 and second protective film 126, whereby second protective film 126 can be prevented from rising from interlayer dielectric film 111.

Modification of Fourth Exemplary Embodiment

Figure 7B:
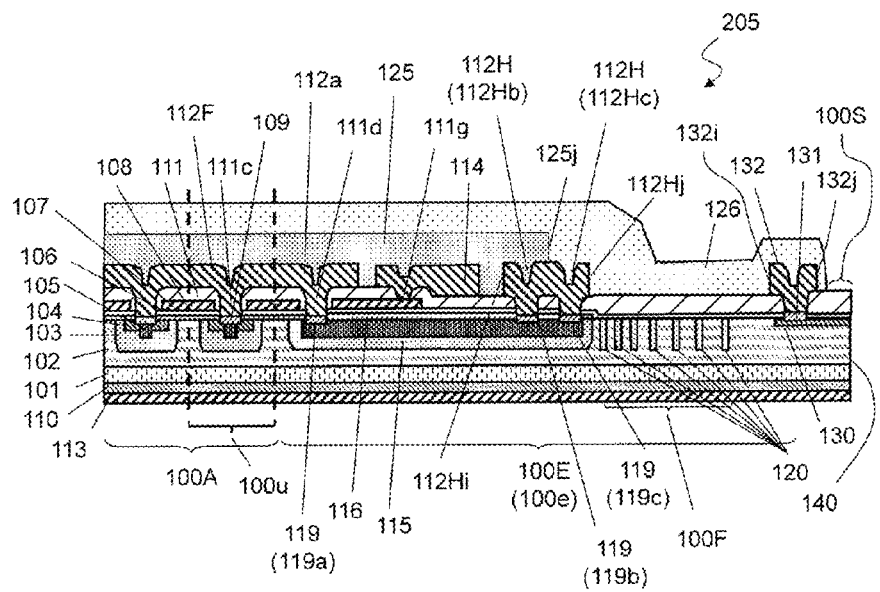
FIG. 7B is a sectional view illustrating a silicon carbide semiconductor device, according to a modification of the fourth exemplary embodiment, taken along line 2A-2A' in FIG. 1A.

Third contact region 130, base electrode 131, and seal electrode 132 may be provided to silicon carbide semiconductor device 202 according to the second exemplary embodiment. FIG. 7B is a sectional view illustrating silicon carbide semiconductor device 205, according to the present modification, taken along line 2A-2A' in FIG. 1A. As illustrated in FIG. 7B, silicon carbide semiconductor device 205 is different from silicon carbide semiconductor device 202 in the second exemplary embodiment in that silicon carbide semiconductor device 205 further includes third contact region 130, base electrode 131, and seal electrode 132 having the above-mentioned structure. Silicon carbide semiconductor device 205 can similarly provide the above-mentioned effect. In addition, although not illustrated, third contact region 130, base electrode 131, and seal electrode 132 may also be provided to silicon carbide semiconductor device 203 in the third exemplary embodiment.

Example 1

Silicon carbide semiconductor devices having the structures described in the above exemplary embodiments were manufactured. Silicon carbide semiconductor devices having the sectional structure illustrated in FIGS. 2A and 2B and silicon carbide semiconductor devices having the sectional structure illustrated in FIGS. 5A and 5B were manufactured as samples 1 and 2. Further, silicon carbide semiconductor devices having the sectional structure illustrated in FIGS. 6A and 6B with D=18 μm and silicon carbide semiconductor devices having the sectional structure illustrated in FIGS. 6A and 6B with D=50 μm were manufactured as samples 3 and 4. For comparison, silicon carbide semiconductor devices not including second protective film 126 and having a termination region covered by first protective film 125 were manufactured as sample 5, and silicon carbide semiconductor devices in which first protective film 125 and second protective film 126 both cover a termination region (including FLR region 100F) were manufactured as sample 6. In the silicon carbide semiconductor devices as samples 5 and 6, an outer-circumferential upper source electrode was further provided outside FLR region 100F. A silicon nitride film formed by a plasma CVD was used for first protective film 125, and a polyimide resin film was used for the second protective film.

Table 1 shows a summary of the structures of samples 1 to 6.

TABLE 1

| Sample | Structure of protective film | Test result |
|---|---|---|
| Sample 1 | Structure in FIGS. 2a and 2b<br>First protective film: 1300 nm<br>Second protective film: 4000 nm | No failure after 2000 h |
| Sample 2 | Structure in FIGS. 5A and 5B<br>First protective film: 1300 nm<br>Second protective film: 4000 nm | No failure after 2000 h |
| Sample 3 | Structure in FIGS. 6A and 6B<br>First protective film: 1300 nm<br>Second protective film: 4000 nm<br>D = 18 μm | No failure after 2000 h |
| Sample 4 | Structure in FIGS. 6A and 6B<br>First protective film: 1300 nm<br>Second protective film: 4000 nm<br>D = 50 μm | No failure after 2000 h |
| Sample 5 | First protective film entirely covers termination region<br>First protective film: 1300 nm | Failure at 940 h, 1220 h |
| Sample 6 | First protective film and second protective film entirely cover termination region<br>First protective film: 1300 nm<br>Second protective film: 4000 nm | Failure at 76 h, 508 h |

The manufactured samples were subjected to a temperature humidity bias (THB) test. Pluralities of manufactured samples were prepared for each sample. The samples were stored with a voltage of 1000 V being applied between a source and a drain at a temperature of 85° C. and relative humidity of 85%. After the storage, a drain leakage current was periodically measured with a reverse bias of 1200 V. When the leakage current exceeded $1\times10^{-6}$ A, it was determined that failure occurred in the silicon carbide semiconductor device.

FIGS. 8A, 8B, 8C, and 8D show the test results of samples 1, 2, 3, and 4. FIGS. 9A and 9B show the results of samples 5 and 6. Table 1 shows a summary of the test results.

Figure 8A:
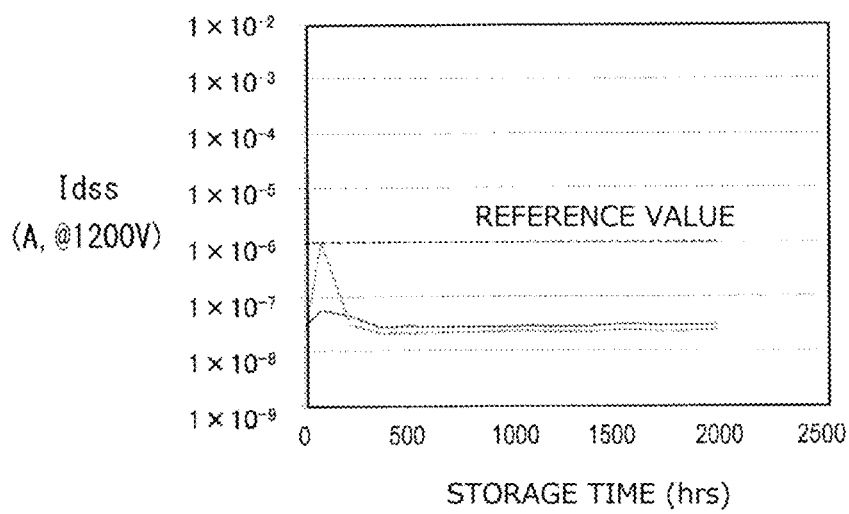
FIG. 8A is a graph showing the result of the THB test conducted using silicon carbide semiconductor devices as sample 1.
Figure 8B:
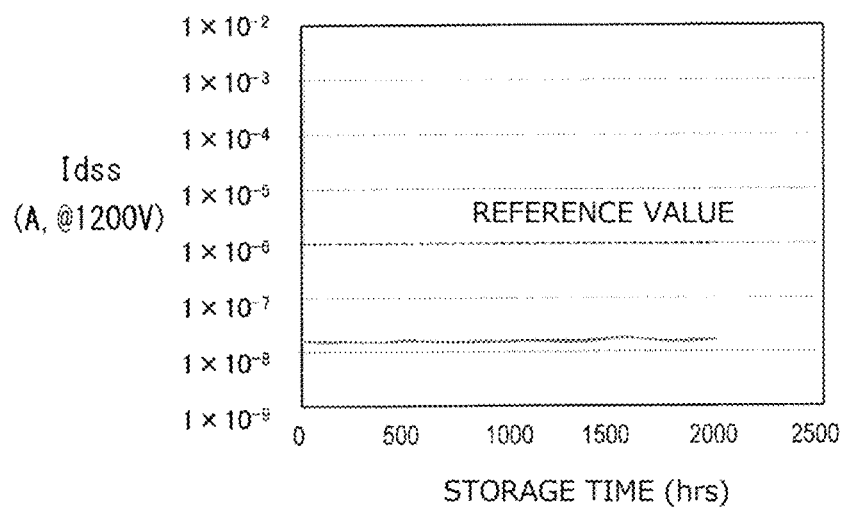
FIG. 8B is a graph showing the result of the THB test conducted using silicon carbide semiconductor devices as sample 2.
Figure 9A:
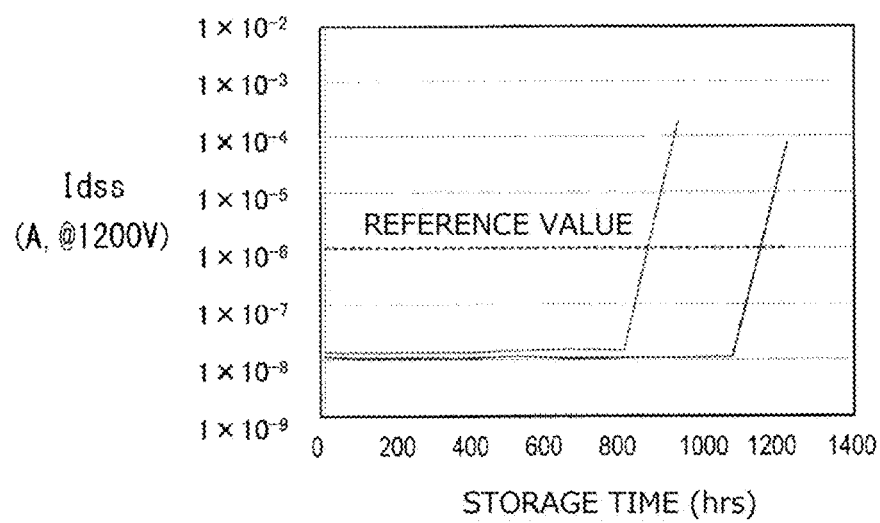
FIG. 9A is a graph showing the result of the THB test conducted using silicon carbide semiconductor devices as sample 5.
Figure 9B:
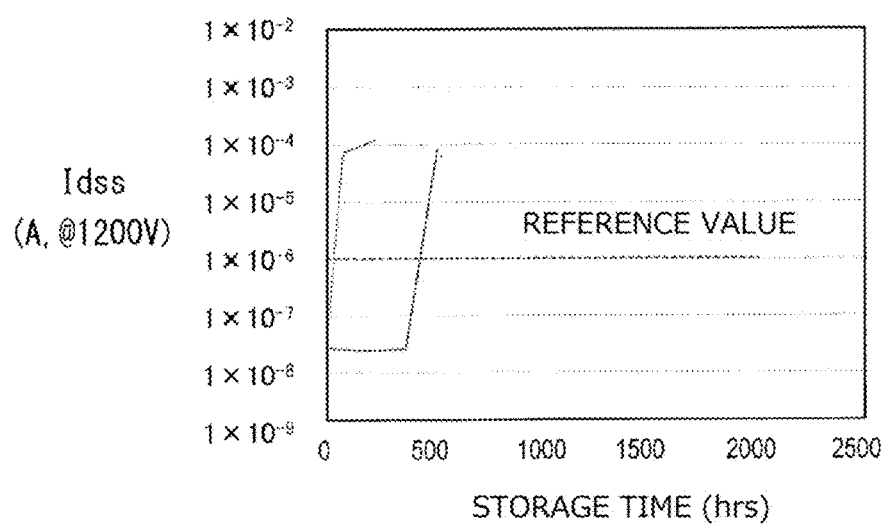
FIG. 9B is a graph showing the result of the THB test conducted using silicon carbide semiconductor devices as sample 6.

As illustrated in Table 1 and FIGS. 8A and 8B, in the silicon carbide semiconductor devices as samples 1 and 2, the leakage current was equal to or lower than the reference ($1\times10^{-6}$ A) even after 2000 hours of the stress time, and no failure was observed. However, in the silicon carbide semiconductor devices as sample 1, the leakage current temporarily rose at about 100 hours after the start of the test, but after that, the leakage current decreased, and it is found that the devices continuously maintained satisfactory characteristics. Further, in the silicon carbide semiconductor devices as sample 2, the leakage current hardly varied regardless of the lapse of time.

Figure 8C:
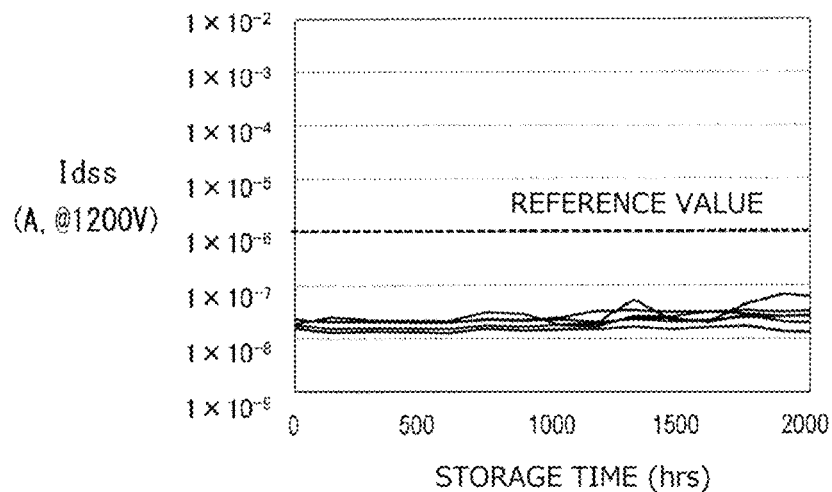
FIG. 8C is a graph showing the result of the THB test conducted using silicon carbide semiconductor devices as sample 3.
Figure 8D:
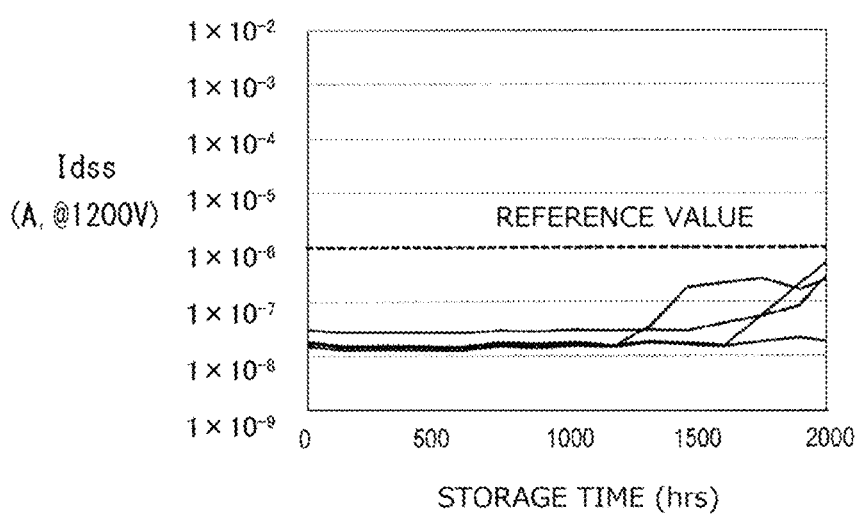
FIG. 8D is a graph showing the result of the THB test conducted using silicon carbide semiconductor devices as sample 4.

As illustrated in Table 1 and FIGS. 8C and 8D, in the silicon carbide semiconductor devices as samples 3 and 4, the leakage current was also equal to or lower than the reference ($1\times10^{-6}$ A) even after 2000 hours of the stress time, and no failure was observed.

On the other hand, as illustrated in Table 1 and FIGS. 9A and 9B, in the silicon carbide semiconductor devices as samples 5 and 6, it was determined that failure occurred before 2000 hours. Failure occurred at about 1000 hours in sample 5, and failure at about 100 and 500 hours in the sample 6.

Figure 10A:
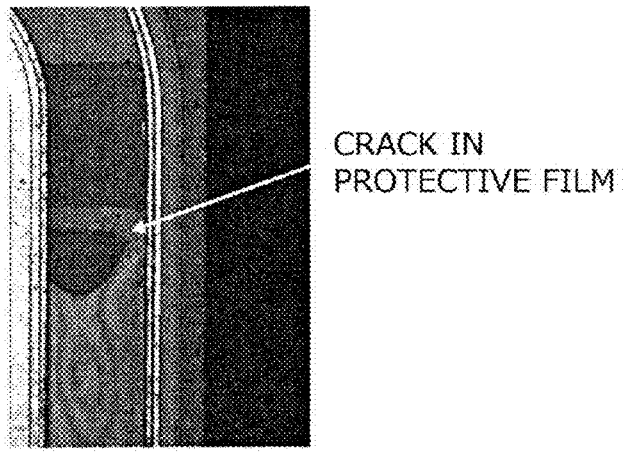
FIG. 10A is a view illustrating the result of observation of the silicon carbide semiconductor device as sample 5 after the THB test.
Figure 10B:
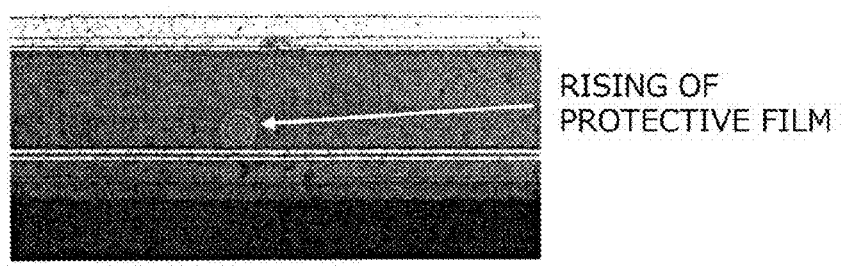
FIG. 10B is a view illustrating the result of observation of the silicon carbide semiconductor device as sample 5 after the THB test.
Figure 11A:
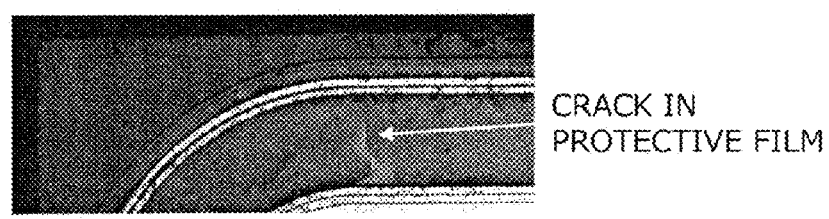
FIG. 11A is a view illustrating the result of observation of the silicon carbide semiconductor device as sample 6 after the THB test.
Figure 11B:
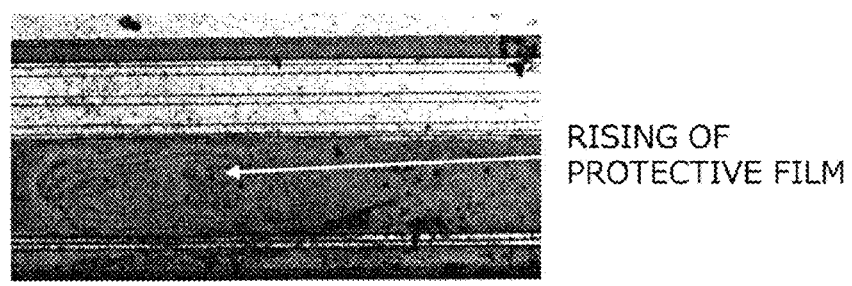
FIG. 11B is a view illustrating the result of observation of the silicon carbide semiconductor device as sample 6 after the THB test.

After the test, each package was opened and each silicon carbide semiconductor device was observed by an optical microscope. FIGS. 10A and 10B illustrate the observation result of sample 5 after the test. FIGS. 11A and 11B illustrate the observation result of the sample 6 after the test. FIGS. 10A and 11A each illustrate the FLR region near the corner of each silicon carbide semiconductor device, and FIGS. 10B and 11B each illustrate the FLR region near the center of one side of each silicon carbide semiconductor device.

Noticeable changes such as cracks or peeling of the protective film were not observed at the corner and near the center of the FLR region in the silicon carbide semiconductor devices as samples 1, 2, 3, and 4. On the other hand, in the silicon carbide semiconductor devices as samples 5 and 6, it is found that the protective film cracked at the corner of the FLR region, and rose near the center of the FLR region.

It is understood from these results that the silicon carbide semiconductor device according to the present exemplary embodiment has reliability for a high-temperature high-humidity bias environment. It is also found that the reliability can be more improved by the configuration in which first protective film 125 does not cover outer side surface 112Hj of outer-circumferential upper source electrode 112H. It is also found that the reliability is likely to degrade if a protective film having high hardness such as a silicon nitride film is provided in the FLR region.

Example 2

As described above, an increase in a drain leakage current due to mobile ions is more likely to occur in a high temperature reverse bias test conducted at a higher temperature than in a temperature humidity bias test. In view of this, a plurality of devices were prepared for each of samples 1, 2, 3, 4, and 5, and they were subjected to the high temperature reverse bias test to observe a variation in the drain leakage current. Each sample was stored with a reverse voltage of 1200 V being applied between the source and the drain at a temperature of 175° C. in the atmosphere (HTRB test). After the storage, a drain leakage current (Idss) was periodically measured with a reverse bias of 1200 V.

FIGS. 12A, 12B, 12C, and 12D show the test results of samples 1, 2, 3, and 4. FIG. 13 shows the test result of sample 5.

Figure 12A:
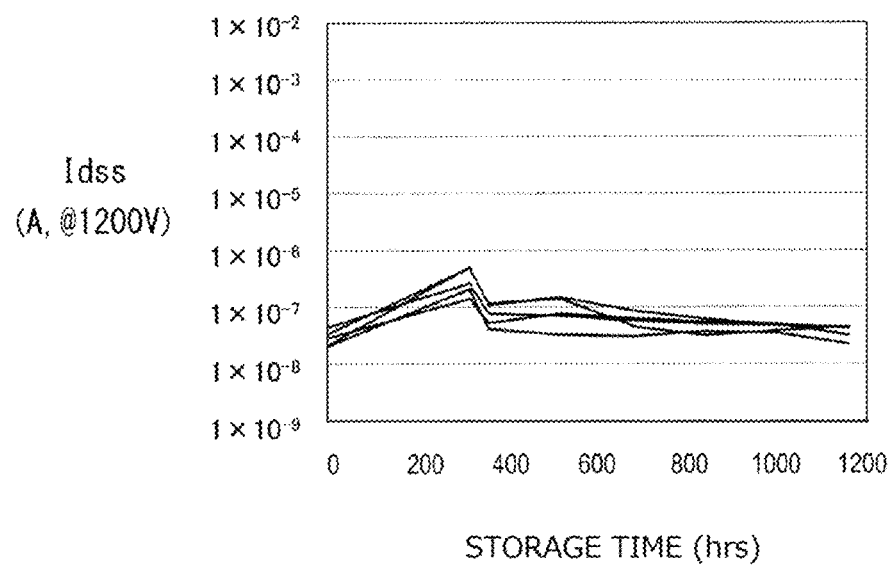
FIG. 12A is a graph showing the result of a high temperature reverse bias (HTRB) test conducted using the silicon carbide semiconductor devices as sample 1.
Figure 12B:
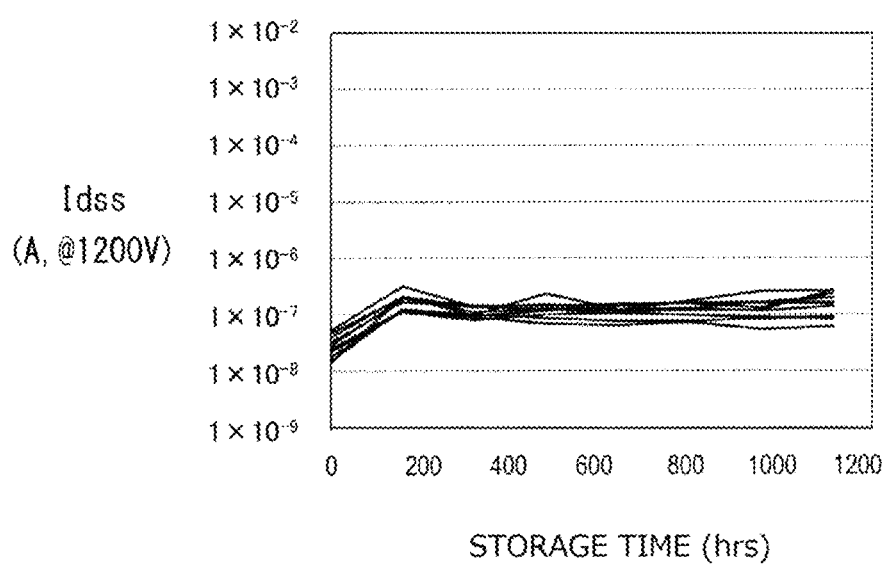
FIG. 12B is a graph showing the result of the HTRB test conducted using the silicon carbide semiconductor devices as sample 2.
Figure 13:
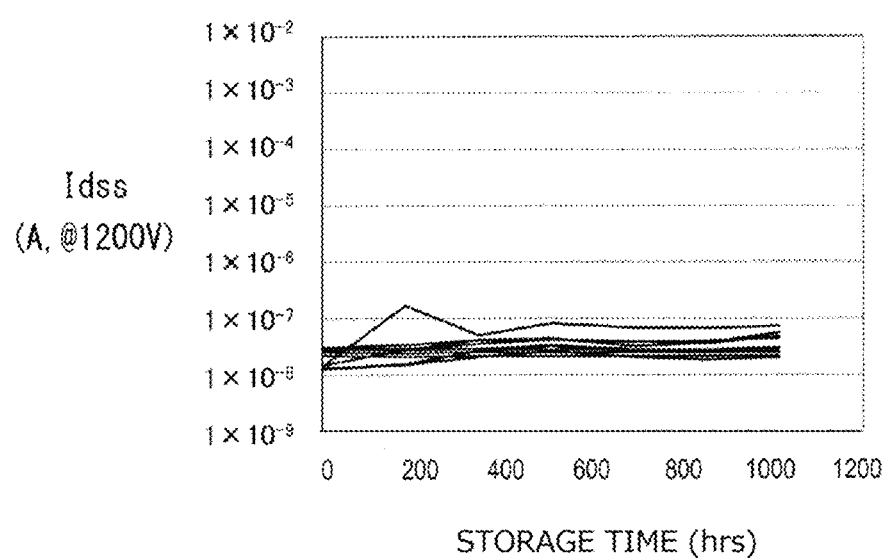
FIG. 13 is a graph showing the result of the HTRB test conducted using the silicon carbide semiconductor devices as sample 5.

As illustrated in FIGS. 12A and 12B, in the silicon carbide semiconductor devices as samples 1 and 2, the drain leakage current became higher than that before the start of the test at the beginning of the high temperature reverse bias test. However, this is about a one-digit increase, and it is not observed that the drain leakage current tends to continuously increase after that. This is considered as follows. Specifically, at the beginning of the high temperature reverse bias test, mobile ions move in the second protective film, which may slightly degrade the breakdown voltage characteristics, but due to less amount of mobile ions included in the second protective film, the degradation in the breakdown voltage characteristics is almost stopped at the beginning of the high temperature reverse bias test.

Figure 12C:
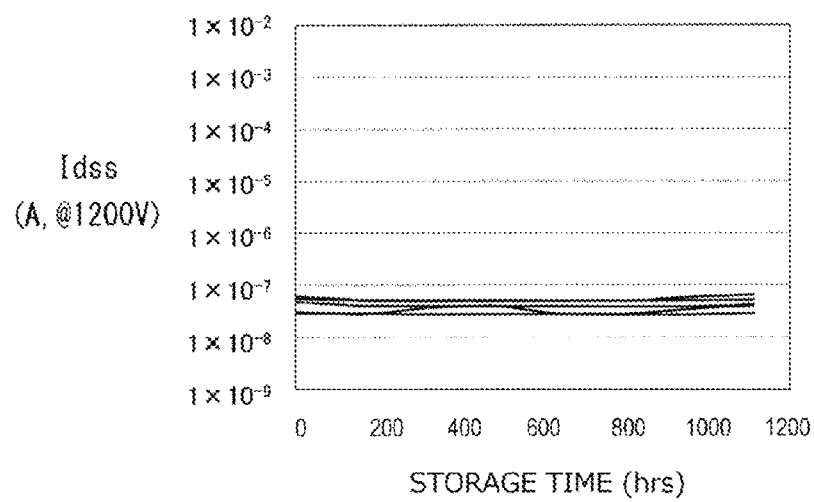
FIG. 12C is a graph showing the result of the HTRB test conducted using the silicon carbide semiconductor devices as sample 3.
Figure 12D:
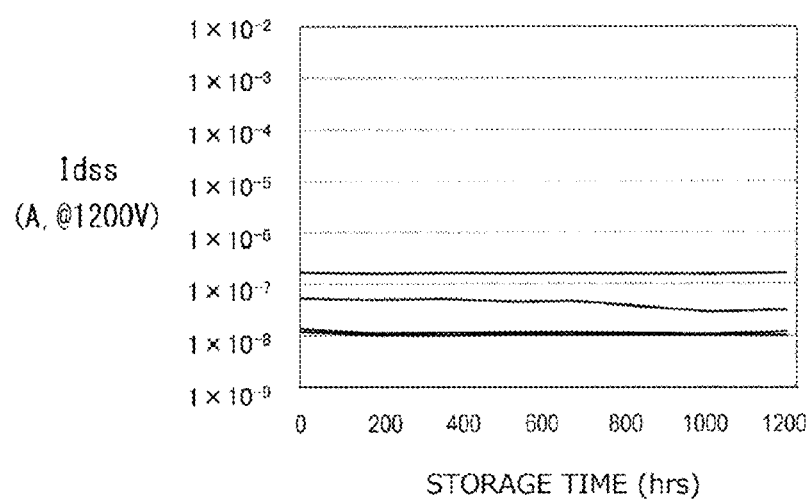
FIG. 12D is a graph showing the result of the HTRB test conducted using the silicon carbide semiconductor devices as sample 4.

As illustrated in FIGS. 12C and 12D, in the silicon carbide semiconductor devices as samples 3 and 4, the drain leakage current hardly varied. Further, as illustrated in FIG. 13, in the silicon carbide semiconductor devices as sample 5, the drain leakage current hardly varied except for one of the devices as sample 5.

It is found from these results that the structure in the third exemplary embodiment particularly exhibits excellent reliability in the high temperature reverse bias test.

It is found from the above results that the structures in the first, second, and third exemplary embodiments all exhibit excellent reliability in the temperature humidity bias test and the high temperature reverse bias test, and particularly the structure in the third exemplary embodiment has little increase in the drain leakage current in the high temperature reverse bias test, and thus is more reliable than the structures in the first and second exemplary embodiments.

The silicon carbide semiconductor device according to the present disclosure is widely applicable to semiconductor devices for various purposes and various drive devices provided with the same, such as inverter circuits. For example, the silicon carbide semiconductor device is well applicable to semiconductor devices to be mounted on vehicles or for industrial devices.

What is claimed is:

1. A silicon carbide semiconductor device comprising:
a first conductivity type silicon carbide substrate having an active region and a termination region surrounding the active region in a plan view;
a plurality of unit cells located in the active region; and
a termination structure located in the termination region, wherein:
each of the unit cells includes:
the first conductivity type silicon carbide substrate;
a first silicon carbide semiconductor layer disposed on the first conductivity type silicon carbide substrate;
a first body region of a second conductivity type selectively formed in a surface of the first silicon carbide semiconductor layer;
a source region selectively formed in the first body region;
a gate insulating film disposed above the first silicon carbide semiconductor layer;
a gate electrode disposed on the gate insulating film;
a first contact region in contact with the first body region; and
an inner-circumferential upper source electrode electrically connected to the first contact region and the source region, and
the termination structure includes:
the first conductivity type silicon carbide substrate;
the first silicon carbide semiconductor layer disposed on the first conductivity type silicon carbide substrate;
a second body region of a second conductivity type selectively formed in a surface of the first silicon carbide semiconductor layer and having an annular shape surrounding the active region in a plan view;
one or more second conductivity type rings disposed in the surface of the first silicon carbide semiconductor layer and surrounding the second body region in a plan view;
a second contact region of a second conductivity type selectively formed in a surface of the second body region;
an interlayer dielectric film disposed above the second contact region;
one or more outer-circumferential upper source electrodes which are disposed on the interlayer dielectric film, penetrate the interlayer dielectric film to be electrically connected to the second contact region, and surround the active region in a plan view; and
an upper gate electrode electrically connected to the gate electrode, the upper gate electrode is located between the inner-circumferential upper source electrode in the active region and the one or more outer-circumferential upper source electrodes in a plan view,
the silicon carbide semiconductor device further comprising:
a first protective film which covers the inner-circumferential upper source electrode, the upper gate electrode, and an inner surface of an innermost outer-circumferential upper source electrode among the one or more outer-circumferential upper source electrodes, in the active region and the termination region except for a pad region, the first protective film being made of silicon nitride; and
a second protective film which covers the first protective film and at least a part of the one or more second conductivity type rings, in the active region and the termination region, the second protective film being made of an organic material.

2. The silicon carbide semiconductor device according to claim 1, wherein the one or more outer-circumferential upper source electrodes and the inner-circumferential upper source electrode are electrically connected to each other.

3. The silicon carbide semiconductor device according to claim 1, wherein an outer side surface of the first protective film is positioned between an outermost outer-circumferential upper source electrode among the one or more outer-circumferential upper source electrodes and the one or more second conductivity type rings in a plan view.

4. The silicon carbide semiconductor device according to claim 1, wherein:
an outer side surface of the first protective film is positioned on an outermost outer-circumferential upper source electrode among the one or more outer-circumferential upper source electrodes in a plan view, and
an outer side surface of the outermost outer-circumferential upper source electrode among the one or more outer-circumferential upper source electrodes is in direct contact with the second protective film.

5. The silicon carbide semiconductor device according to claim 1, wherein:
the termination structure includes two or more of the second conductivity type rings, and
the first protective film covers at least an innermost second conductivity type ring among the two or more of the second conductivity type rings, and does not cover at least an outermost second conductivity type ring among the two or more of the second conductivity type rings.

6. The silicon carbide semiconductor device according to claim 1, wherein:
the termination structure includes three or more of the second conductivity type rings, and
the first protective film covers at least two or more of the second conductivity type rings including an innermost second conductivity type ring among the three or more of the second conductivity type rings, and does not cover at least an outermost second conductivity type ring among the three or more of the second conductivity type rings.

7. The silicon carbide semiconductor device according to claim 6, wherein:
on a cross-section perpendicular to a direction in which the three or more of the second conductivity type rings extend, a distance between an inner side surface of the innermost second conductivity type ring and an outer side surface of the outermost second conductivity type ring ranges from 60 μm to 120 μm, inclusive, and
on the cross section, a distance between an outer side surface of the first protective film and an outer side surface of the innermost second conductivity type ring ranges from 18 μm to 50 μm, inclusive.

8. The silicon carbide semiconductor device according to claim 1, wherein:
the silicon carbide substrate has a scribe line region, and
the second protective film does not cover the scribe line region.

9. The silicon carbide semiconductor device according to claim 1, wherein:
the termination structure includes:
a first base electrode disposed on a surface of the second contact region at an inner-circumferential-side of the second contact region, the first base electrode electrically contacting with the second contact region, and
a second base electrode disposed on a surface of the second contact region at an outer-circumferential-side of the second contact region, the second base electrode electrically contacting with the second contact region, and
the first base electrode is electrically connected to the inner-circumferential upper source electrode, and the second base electrode is electrically connected to the one or more outer-circumferential upper source electrodes.

10. The silicon carbide semiconductor device according to claim 9, wherein the second base electrode surrounds the active region on a surface of the second contact region in a plan view.

11. The silicon carbide semiconductor device according to claim 1, further comprising, in a surface of the first silicon carbide semiconductor layer:
a third contact region located outside of the one or more second conductivity type rings and selectively formed so as to surround the one or more second conductivity type rings in a plan view;
a third base electrode electrically contacting with the third contact region; and
a seal electrode connected to the third electrode, the seal electrode surrounding an outermost second conductivity type ring among the one or more second conductivity type rings in a plan view.

12. The silicon carbide semiconductor device according to claim 11, wherein the second protective film covers the seal electrode.

* * * * *